US009865351B2

(12) United States Patent
Maejima

(10) Patent No.: US 9,865,351 B2
(45) Date of Patent: Jan. 9, 2018

(54) MEMORY SYSTEM WITH NON-VOLATILE MEMORY DEVICE THAT IS CAPABLE OF SINGLE OR SIMULATANEOUS MULTIPLE WORD LINE SELECTION

(71) Applicant: TOSHIBA MEMORY CORPORATION, Tokyo (JP)

(72) Inventor: Hiroshi Maejima, Setagaya Tokyo (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/175,772

(22) Filed: Jun. 7, 2016

(65) Prior Publication Data
US 2017/0075595 A1 Mar. 16, 2017

(30) Foreign Application Priority Data

Sep. 11, 2015 (JP) .................. 2015-179872

(51) Int. Cl.
| | | |
|---|---|---|
| *G11C 16/06* | (2006.01) | |
| *G06F 3/06* | (2006.01) | |
| *G11C 16/26* | (2006.01) | |
| *G06F 1/32* | (2006.01) | |
| *G06F 11/07* | (2006.01) | |

(Continued)

(52) U.S. Cl.
CPC ............ *G11C 16/06* (2013.01); *G06F 1/32* (2013.01); *G06F 3/0616* (2013.01); *G06F 3/0647* (2013.01); *G06F 3/0688* (2013.01); *G06F 11/073* (2013.01); *G06F 11/0793* (2013.01); *G11C 16/26* (2013.01); *G11C 16/3431* (2013.01); *G06F 11/00* (2013.01); *G11C 16/04* (2013.01); *G11C 2211/5641* (2013.01)

(58) Field of Classification Search
CPC ......... G11C 16/06; G11C 11/56; G11C 16/26; G11C 16/10; G11C 16/04; G06F 1/32; G06F 3/0647; G06F 3/0688; G06F 3/0616; G06F 11/00
See application file for complete search history.

(56) References Cited

U.S. PATENT DOCUMENTS 5,777,925 A 7/1998 Tokushige
7,852,676 B2 12/2010 Maejima
(Continued)

FOREIGN PATENT DOCUMENTS

JP 2007-266143 A 10/2007

OTHER PUBLICATIONS

Taiwanese Office Action dated May 16, 2017 in related Taiwanese Patent Application 105107645 with English translation.

*Primary Examiner* — Harry W Byrne
*Assistant Examiner* — Ajay Ojha
(74) *Attorney, Agent, or Firm* — Patterson & Sheridan, LLP

(57) ABSTRACT

A memory system includes a memory device including a memory cell array having a first region of multiple first memory cells and a second region of multiple second memory cells, first word lines each connected to a gate of one of the first memory cells, and second word lines each connected to a gate of one of the second memory cells, and a controller configured to control an operation of the memory device. The memory device selects one word line when reading from or writing to the first memory cells and selects more than one word line when reading from or writing to the second memory cells.

20 Claims, 18 Drawing Sheets

(51) Int. Cl.
  *G11C 16/34* (2006.01)
  *G11C 16/04* (2006.01)
  *G06F 11/00* (2006.01)

(56) References Cited

U.S. PATENT DOCUMENTS

| | | | |
|---|---|---|---|
| 7,859,902 B2 | 12/2010 | Maejima | |
| 8,634,240 B2* | 1/2014 | Gavens | G11C 11/5628 365/185.03 |
| 2012/0191900 A1* | 7/2012 | Kunimatsu | G06F 3/0679 711/103 |
| 2012/0218818 A1 | 8/2012 | Han et al. | |
| 2012/0266002 A1* | 10/2012 | Kim | G11C 7/22 713/320 |
| 2012/0284574 A1* | 11/2012 | Avila | G11C 16/28 714/704 |
| 2013/0265825 A1* | 10/2013 | Lassa | G06F 3/0619 365/185.11 |
| 2016/0284393 A1* | 9/2016 | Ramalingam | G11C 11/5628 |

\* cited by examiner

TBL1

| BLOCK No. | PAGE No. | NUMBER OF TIMES OF READING | DATE AND TIME OF WRITING | DATE AND TIME OF FINAL READING |
|---|---|---|---|---|
| 0 | 0 | x0 | tw0 | tr0 |
| | 1 | x1 | tw1 | tr1 |
| | 2 | x2 | tw2 | tr2 |
| | ⋮ | ⋮ | ⋮ | ⋮ |
| 1 | 0 | xa | twa | twa |
| | 1 | xb | twb | twb |
| | 2 | xc | twc | twc |

MEMORY SYSTEM WITH NON-VOLATILE MEMORY DEVICE THAT IS CAPABLE OF SINGLE OR SIMULATANEOUS MULTIPLE WORD LINE SELECTION

CROSS-REFERENCE TO RELATED APPLICATION

This application is based upon and claims the benefit of priority from Japanese Patent Application No. 2015-179872, filed Sep. 11, 2015, the entire contents of which are incorporated herein by reference.

FIELD

Embodiments described herein relate generally to a memory system.

BACKGROUND

A NAND flash memory in which memory cells are arranged in three dimensions is known.

DETAILED DESCRIPTION

Figure 1:
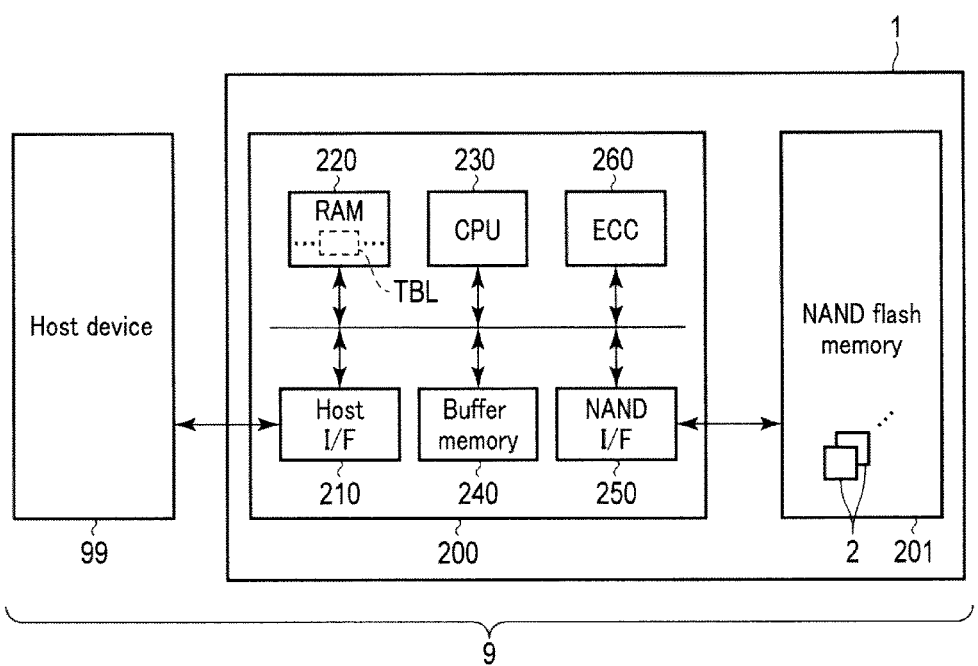
FIG. 1 is a block diagram illustrating a memory system according to an embodiment.

Embodiments provide a memory system with improved reliability.

In general, according to an embodiment, a memory system includes a memory device that includes a memory cell array having a first region of multiple first memory cells and a second region of multiple second memory cells, first word lines each connected to a gate of one of the first memory cells, and second word lines each connected to a gate of one of the second memory cells, and a controller configured to control an operation of the memory device. The memory device selects one word line when reading from or writing to the first memory cells and selects more than one word line when reading from or writing to the second memory cells.

Hereinafter, embodiments will be described with reference to the drawings. Moreover, in the following description, the common reference numerals are given to configuration elements including the same function and configuration.

In addition, in the following, in a case where reference symbols (for example, a word line WL, a bit line BL, various voltages and signals, and the like) are used with numbers/English letters at an end thereof, such reference symbols may be used without the numbers/English letters at an end thereof to identify corresponding elements that are not distinguished from each other.

Embodiment

A memory system according to an embodiment will be described with reference to FIGS. 1 to 21.

1) Embodiment (a) Configuration

A configuration example of the memory system according to the embodiment will be described with reference to FIGS. 1 to 8.

As illustrated in FIG. 1, a memory system 9 includes a storage device 1 and a host device 99.

The host device 99 is, for example, coupled to the storage device 1 by a connector, wireless communication, the Internet, and the like.

The host device 99 requests writing/erasing of data and reading of the data to the storage device 1.

The storage device 1 includes a memory controller 200 and a semiconductor memory (memory device) 201.

The memory controller 200 causes the semiconductor memory 201 to execute an operation in accordance with a request of the host device 99.

The memory controller 200 includes, for example, a host interface circuit 210, a work memory (RAM) 220, a processor (CPU) 230, a buffer memory 240, a memory interface circuit 250, and an ECC circuit 260.

The host interface circuit 210 couples the memory controller 200 to the host device 99. The host interface circuit 210 controls communication with the host device 99 to process requests and data from the host device 99.

The work memory 220 and the buffer memory 240 temporarily hold various data, programs (software/firmware), and management information (management table) that are used within the memory system 9.

For example, the work memory 220 is a DRAM and is used as a working area of the CPU 230. The work memory 220 temporarily holds the software/firmware for controlling an operation of the semiconductor memory 201 and one or more management tables TBL for managing the semiconductor memory 201. For example, the buffer memory 240 is a SRAM. The buffer memory 240 temporarily holds data transmitted between the host device 99 and the semiconductor memory 201.

The CPU 230 controls the entire operation of the memory controller 200. For example, the CPU 230 issues a command in accordance with a request from the host device 99 based on interface standards. The CPU 230 refers to information within the management table TBL and controls the operation of the semiconductor memory 201. The CPU 230 executes various processing such as wear leveling for managing the semiconductor memory 201. The CPU 230 executes, for example, various calculations such as encryption processing and randomizing processing of data.

The memory interface circuit 250 is connected to the semiconductor memory 201 via a bus. The memory interface circuit 250 controls communication with the semiconductor memory 201. The memory interface circuit 250 transmits a command from the CPU 230 to the semiconductor memory 201. The memory interface circuit 250 transfers data within the buffer memory 240 to the semiconductor memory 201 during writing data into the semiconductor memory 201. The memory interface circuit 250 transfers data from the semiconductor memory 201 to the buffer memory 240 during reading of data from the semiconductor memory 201.

The ECC circuit 260 executes error checking and correcting (ECC) processing of data. The ECC circuit 260 generates parity based on the write data during writing of data. The ECC circuit 260 generates a syndrome based on the parity and detects errors within the data during reading of the data. The ECC circuit 260 corrects detected errors. In addition, the CPU 230 may include a function of the ECC circuit 260.

The semiconductor memory 201 stores data. The semiconductor memory 201 executes writing of the data and reading of the data based on an instruction from the controller 200.

The semiconductor memory 201 includes one or more memory chips 2 provided within a package. The semiconductor memory 201 is, for example, a NAND flash memory. For example, the storage device 1 (or the memory system) including a flash memory is a memory card (for example, SD™ card), a USB memory, a solid state drive (SSD), or the like.

Figure 2:
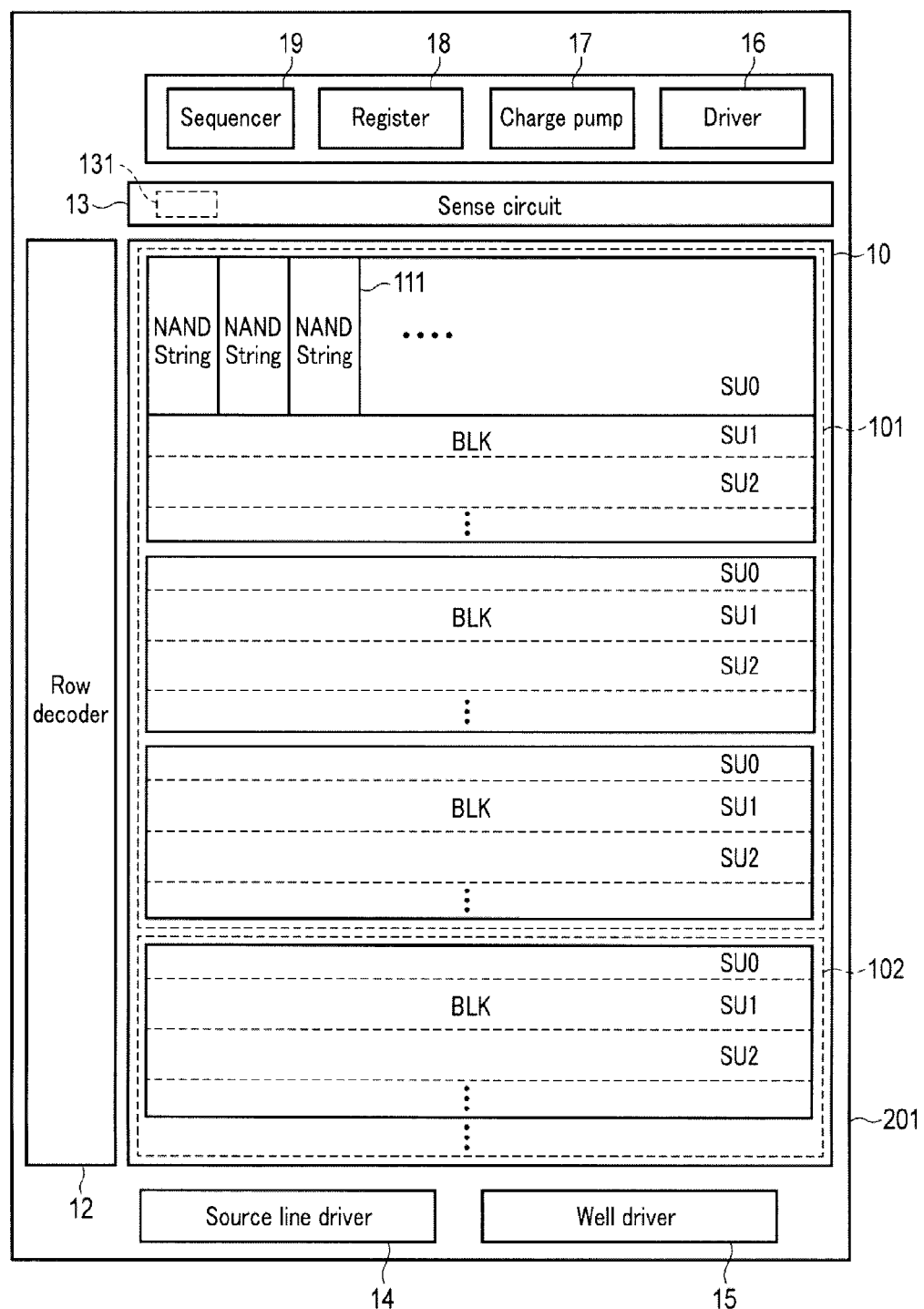
FIG. 2 is a block diagram illustrating an example of an internal structure of a semiconductor memory.

As illustrated in FIG. 2, the NAND flash memory 201 includes a memory cell array 10, a row decoder 12, a sensing circuit 13, a source line driver 14, a well driver 15, a driver 16, a charge pump (voltage generation circuit) 17, a register 18, a sequencer 19, and the like.

The memory cell array 10 includes a first region 101 and a second region 102.

The first and second regions 101 and 102 include one or more blocks BLK. The block BLK is a unit of erasing data. Each of the blocks BLK includes multiple (for example, four) string units SU (SU0, SU1, SU2, . . . ). The multiple string units SU are sets of NAND strings (memory strings) 111. The NAND string 111 includes multiple memory cells that are connected in series. The number of blocks within the memory cell array 10, the number of string units within one block BLK, and the number of the memory cells within the NAND string 111 are arbitrarily selected.

An internal configuration of the memory cell array 10 will be described later.

The row decoder 12 decodes a block/page address and selects a word line within the block BLK corresponding to the address. The row decoder 12 applies a voltage for operating the memory cell array 10 to the word line.

The sensing circuit 13 senses and amplifies a signal output to a bit line within the memory cell array 10 during reading of the data. Accordingly, the sensing circuit 13 reads data held in the memory cell. In addition, the sensing circuit 13 controls a voltage of the bit line in accordance with a signal corresponding to the write data during writing of the data. For example, the sensing circuit 13 includes a page buffer 131. The page buffer 131 temporarily holds data output from the memory cell array 10 and data input into the memory cell array 10. Input and output (writing of data and reading of data) of data with respect to the memory cell array 10 are simultaneously performed with respect to a unit of memory cell transistors MT connected to the word line WL that is selected in any one of the string units SU. The unit is referred to as "page". The page buffer 131 can hold data for 1 page.

The source line driver 14 controls a potential of a source line within the memory cell array 10.

The well driver 15 applies a voltage to a well region in which the NAND string 111 is provided.

The driver 16 supplies a voltage for writing, reading, and erasing to the row decoder 12, the sensing circuit 130, the source line driver 14, and the well driver 15 according to control of the sequencer 19.

The charge pump 17 generates various voltages applied to each wiring within the memory cell array 10.

The register 18 can hold various signals. The register holds, for example, a status of writing and erasing operations. Thus, the flash memory 201 can notify whether or not the operation is normally completed to the memory controller 200. The register 18 also holds a command, an address, and the like received from the memory controller 200. The register 18 can also hold various tables (management information).

The sequencer 19 controls the entire operation of the flash memory 201. The sequencer 19 controls the operations inside of the flash memory 201 based on control signals and commands transmitted and received between the memory controller 200 and the flash memory 201.

Configuration of Three Dimensional Structure Memory Cell Array

An example of an internal configuration of a three dimensional structure memory cell array in the embodiment will be described with reference to FIGS. 3 to 5.

Figure 3:
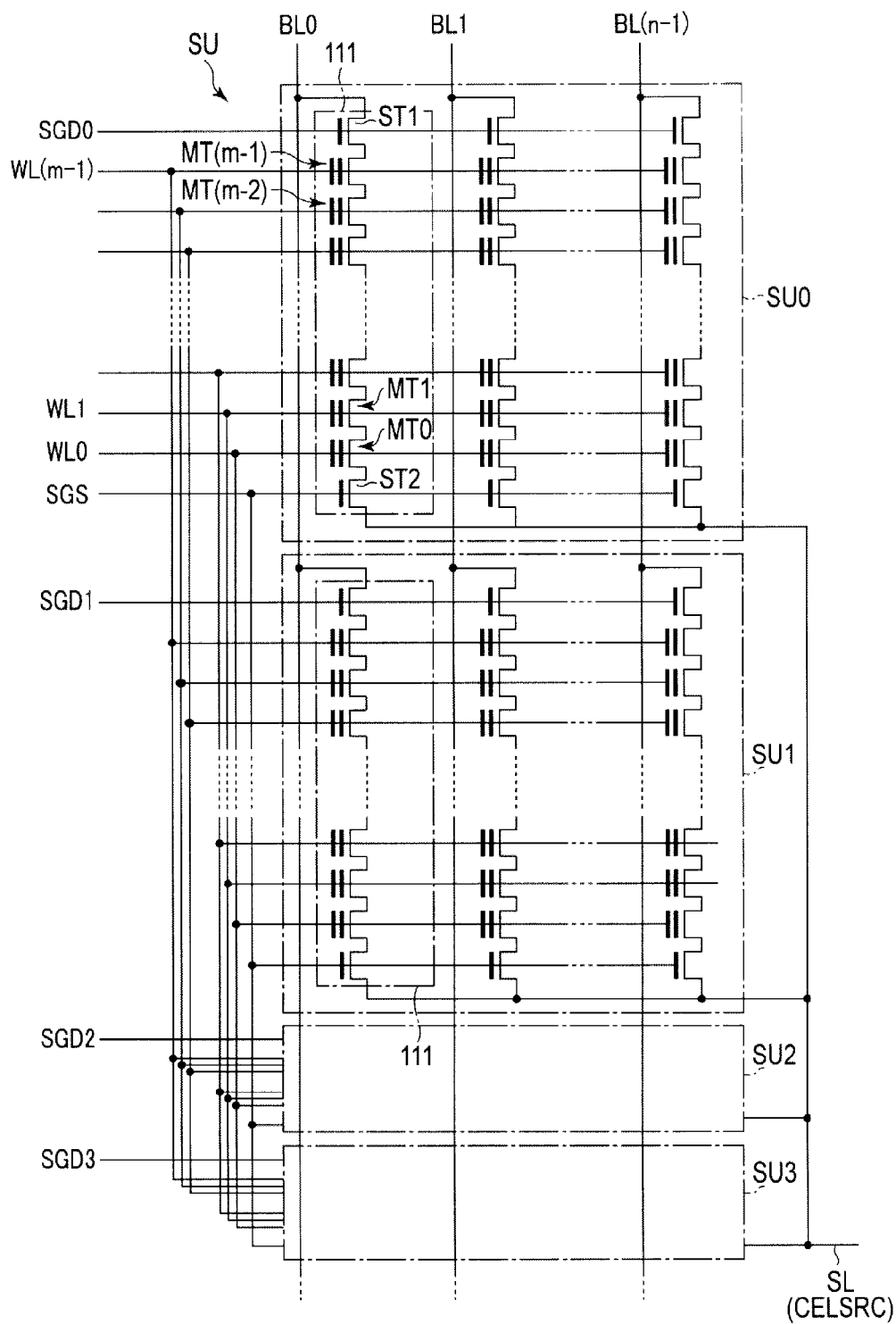
FIG. 3 is a circuit diagram illustrating an example of an internal structure of a memory cell array.

As illustrated in FIG. 3, the NAND string 111 includes multiple memory transistors (also referred to as memory units or memory elements) MT (MT0, MT1, . . . , MTm−2, MTm−1) and two select transistors ST1 and ST2. In addition, "m−1" is a natural number of 1 or more.

The memory transistor MT includes a control gate and a charge storage layer (memory film). In the NAND string 111, the multiple memory transistors MT are connected in series between the select transistors ST1 and ST2. One end (source/drain) of the drain-side memory transistor MTm−1 in the multiple memory transistors MT that are connected in series is connected to one end of the drain-side select transistor ST1. One end of the source-side memory transistor MT0 in the multiple memory transistors MT that are connected in series is connected to one end of the source-side select transistor ST2.

Multiple drain-side select gate lines SGD0 to SGD3 are respectively connected to gates of the drain-side select transistors ST1 of different NAND strings 111 in the same string unit SU.

One source-side select gate line SGS is commonly connected to gates of the source-side select transistors ST2 of all NAND strings 111 in one block. Alternatively, multiple source-side select gate lines SGS may be provided within one block BLK so as to separately control the source-side select gate lines SGS within the block BLK.

The word lines WL0 to WLm−1 are respectively connected to control gates of the memory transistors MT0 to MTm−1 having the same numerical extension, e.g., WL0 is connected to MT0, WL1 connected to MT1, etc., within the same block BK.

One end of the drain-side select transistor ST1 is connected to one of the bit lines BL (BL0 to BL(n−1)). In addition, "n−1" is a natural number of 1 or more.

The other end of the source-side select transistor ST2 is connected to the source line SL.

Figure 4:
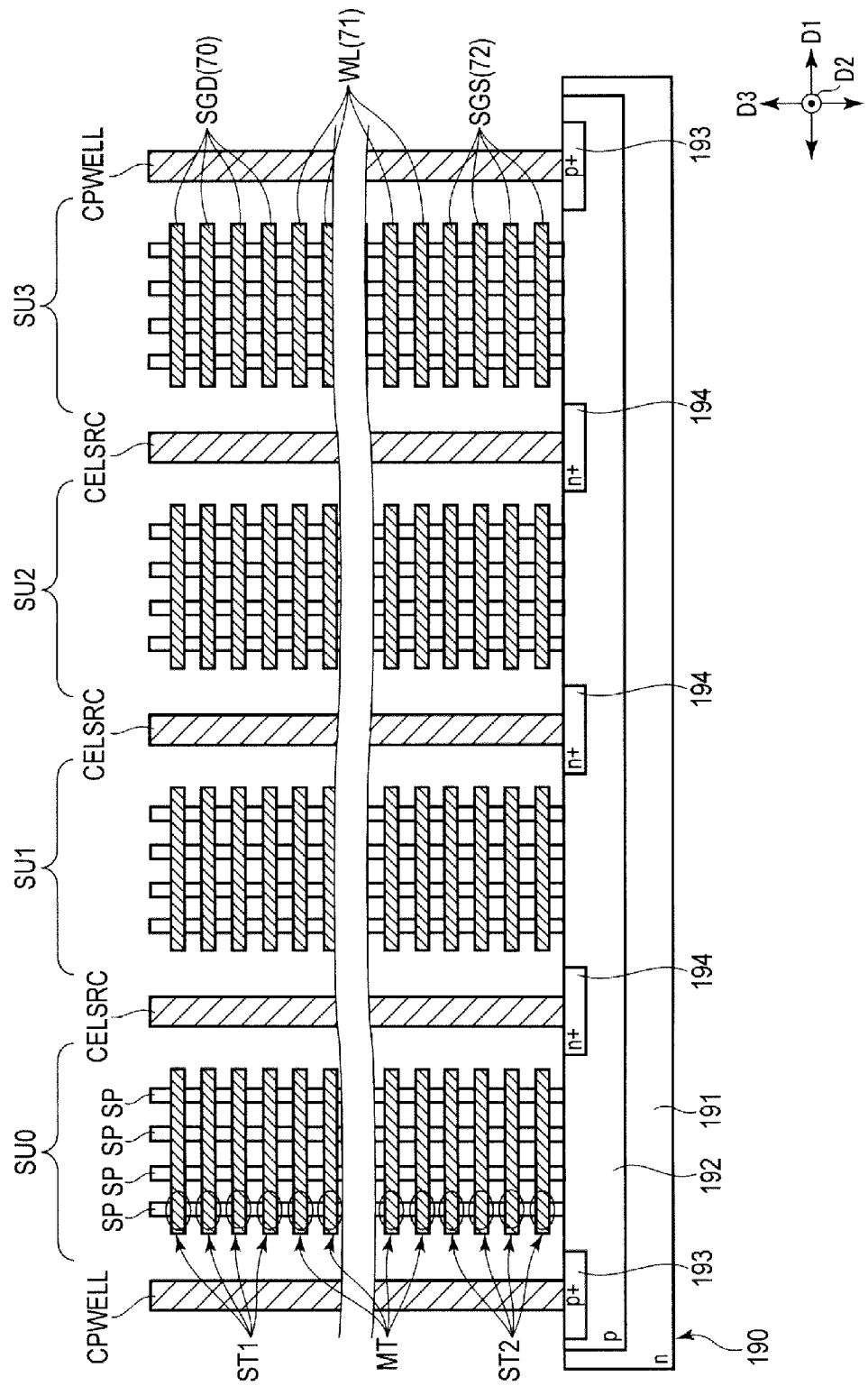
FIG. 4 is a sectional view illustrating an example of a structure of the memory cell array.

As illustrated in a schematic sectional structure view of FIG. 4, within the memory cell array, the NAND string 111 is provided on a p-type well region 192 within a semiconductor region (for example, Si substrate) 190.

The p-type well region 192 is connected to the well driver 15 via a well contact CPWELL. The p-type well region 192 defines the region of the block BLK. For example, the NAND string 111 within the block BLK is provided within a region surrounded by the well contact CPWELL. The well contact CPWELL is provided on a $p^+$ type diffusion layer 103 within the p-type well region 192.

A source line contact CELSRC is provided on an $n^+$ type diffusion layer 194 within the p-type well region 192 between the string units SU. The source line contact CELSRC is connected to the source line SL.

The NAND string 111 includes a semiconductor pillar SP. The semiconductor pillar SP is connected to the p-type well region 192. The semiconductor pillar SP extends substantially in the vertical direction (D3 direction) with respect to a surface of the p-type well region 192.

The semiconductor pillars SP are arranged in an array shape above an n-type well region 191 within a substrate 190 in a D1 direction and a D2 direction.

The bit line (not illustrated) is provided above an upper end of the semiconductor pillar SP.

Multiple conductive layers 70, 71, and 72 are stacked on the p-type well region 192. Each of the conductive layers 70, 71, and 72 is provided on a side surface of the semiconductor pillar SP via a memory film (not illustrated).

The select transistors ST1 are arranged in a region including the semiconductor pillar SP and the conductive layer 70. Multiple (four in the embodiment) stacked conductive layers 70 are gate electrodes of the select transistors ST1. The stacked conductive layers 70 are connected to the same drain-side select gate lines SGD.

The source-side select transistors ST2 are arranged in a region including the semiconductor pillar SP and the conductive layer 72. Multiple (four in the embodiment) stacked conductive layers 72 are gate electrodes of the select transistors ST2. The stacked conductive layers 72 are connected to the source-side select gate lines SGS.

The memory transistors MT are arranged in a region including the semiconductor pillar SP and the conductive layer 71. The conductive layer 71 functions as the word line WL.

Figure 5:
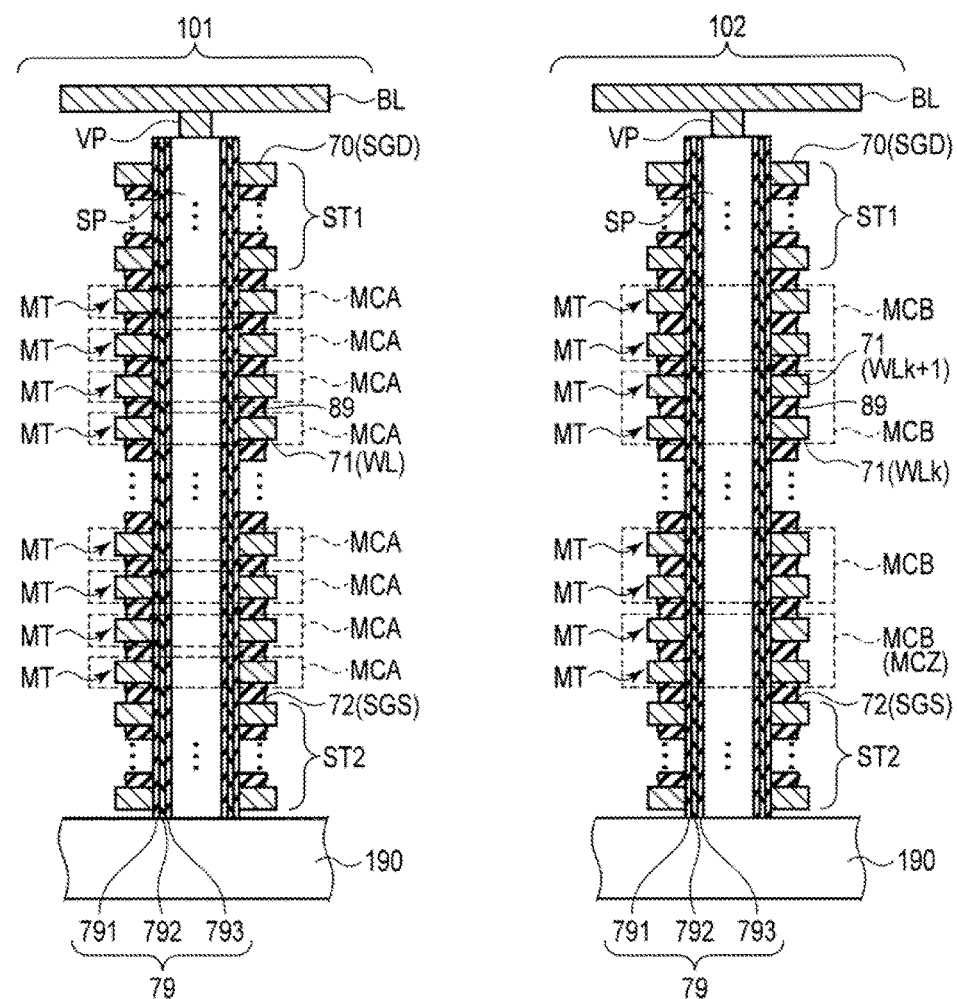
FIG. 5 is a more detailed sectional view illustrating an example of the structure of the memory cell array.

As illustrated in FIG. 5, the memory transistor MT includes a memory film 79 between the semiconductor pillar SP and the conductive layer (word line) 71. The memory film 79 covers a side surface of the semiconductor pillar SP. The memory film 79 is continuous between an upper end and a lower end of the semiconductor pillar SP.

The memory film 79 includes a stacked structure. The memory film 79 includes a gate insulating film 793, a charge storage layer 792, and a block insulating film 791.

The gate insulating film (also referred to as "tunnel insulating film") 793 is provided on the side surface of the semiconductor pillar SP. The charge storage layer 792 is provided between the gate insulating film 793 and the block insulating film 791. The block insulating film 791 is provided between the charge storage layer 792 and the conductive layer 71.

The conductive layer 71 functions as the word line WL and functions as a control gate electrode of the memory transistor MT. One memory transistor MT includes one control gate electrode (conductive layer) 71.

An interlayer insulating film 89 is provided between the conductive layers 70, 71, and 72 in the D3 direction (the vertical direction with respect to the semiconductor substrate surface).

A via plug VP is provided on an upper end of the semiconductor pillar SP. The bit line BL is connected to the semiconductor pillar SP through the via plug VP.

In addition, a dimension, e.g., cross-sectional area, on an upper end side (bit line side) of the semiconductor pillar SP may be greater than a dimension, e.g., cross-sectional area, of the semiconductor pillar SP on a lower end side (substrate side). In this case, in the multiple memory transistors provided on the common semiconductor pillar SP, a size of the memory transistor on the upper end side of the semiconductor pillar SP may be different from a size of the memory transistor on the lower end side of the semiconductor pillar SP. However, the memory transistors MT that are positioned at the same height (layer) above the surface of the substrate 190 have substantially the same size within the first and second regions 101 and 102.

Further details of a structure, an operation, and a manufacturing method of the three dimensional structure memory cell array according to the embodiment are described in "THREE-DIMENSIONAL STACKED NONVOLATILE SEMICONDUCTOR MEMORY" of U.S. patent application Ser. No. 12/407,403, filed on Mar. 19, 2009, in "THREE-DIMENSIONAL STACKED NONVOLATILE SEMICONDUCTOR MEMORY" of U.S. patent application Ser. No. 12/406,524, filed on Mar. 18, 2009, in "NONVOLATILE SEMICONDUCTOR STORAGE APPARATUS AND MANUFACTURING METHOD THEREOF" of U.S. patent application Ser. No. 12/679,991, filed on Mar. 25, 2010, and in "SEMICONDUCTOR MEMORY AND MANUFACTURING METHOD THEREOF" of U.S. patent application Ser. No. 12/532,030, filed on Mar. 23, 2009. The entire contents of all of these applications are incorporated by reference herein.

In the embodiment, the first and second memory cells MCA and MCB within the first and second regions 101 and 102 each have a threshold voltage that is representative of the data stored in the memory cell.

In the flash memory 201 of the embodiment, the configuration of the second memory cell MCB of the second region 102 is different from that of the first memory cell MCA of the first region 101.

The first memory cell MCA includes one memory transistor MT.

The first memory cell MCA can store data of one bit or more by one memory transistor MT.

The second memory cell MCB includes two or more memory transistors MT which are arranged in the direction D3. The memory transistors MT within the second memory cell MCB are provided on the same semiconductor pillar SP.

The second memory cell MCB can store the data of one bit or more by the memory transistors MT of two or more. Hereinafter, for the sake of simplification of the description, a case where the second memory cell MCB includes two memory transistors MT will be described. In this case, the second memory cell MCB includes two control gate electrodes, and two word lines (hereinafter, referred to as word lines WLk and WLk+1) adjacent to each other in the D3 direction are connected to the memory cell MCB. Here, "k" is an integer of 0 or more.

In the second memory cell MCB, the memory film 79 of a portion facing the interlayer insulating film 89 also affects retention characteristics of the data of the memory cell MCB in addition to the memory film 79 of a portion facing the control gate electrode 71.

Thus, if the first and second memory cells MCA and MCB hold the data of the same number of the bits, the retention characteristics of the second memory cell MCB is higher than the retention characteristics of the first memory cell MCA.

Regarding the address within the memory cell array, in the first region 101, one or more page addresses are allocated to one word line WL. In the second region 102, one or more page addresses are allocated to a set of two word lines WLk and WLk+1. Hereinafter, the multiple word lines WLk and WLk+1 connected to one memory cell MCB within the second region 102 may be referred to as a word line set.

In the embodiment, the memory system 9 manages the addresses within the second region 102 by associating the page address of the second region 102 with one word line in the multiple word lines within the word line set. In addition, whether or not a target area of an operation within the memory cell array is the second region 102 is determined by at least one of a command (or a signal included in the command) and a flag (signal of one bit or more) indicating that the second region is the operation target. For example, the flag may be stored in the memory cell array of the flash memory 201 or the ROM region or may be stored in a storage region within the memory controller 200.

For example, the second memory cell MCB is used for storing data including at least one type of data of which reading frequency (access frequency) is low and data of which a storage period is long compared to data that is stored in the first memory cell MCA.

For example, cold data is stored within the second region 102. The cold data is data of which the reading frequency (the access frequency) is low and which is stored within the storage region for a long period of time. For example, the cold data is image data, video data, customer data, raw data of experiment, raw data of statistic, and the like. On the other hand, the data of which the access frequency is high is referred to as hot data.

Hereinafter, the region 102 including the second memory cell MCB is referred to as a cold data region (or long-term storage region or high retention region) 102. For the distinction of description, the region 101 including the first memory cell MCA is referred to as a normal data region 101.

In addition, the normal data region 101 and a cold data region 102 may include a single level cell (SLC) region in which one memory cell holds data of one bit and a multi level cell (MLC) region in which one memory cell holds data of two bits or more.

Information (hereinafter, referred to as coldness information) regarding control of NAND strings (memory cells) within the cold data region 102 may be stored within the cold data region 102. For example, a storage region (page), in which the memory cell (memory cell positioned nearest to the semiconductor substrate) MCB (MCZ) of the lowest layer of the multiple memory cells MCB belongs, holds the coldness information.

Hereinafter, the page storing the coldness information is referred to as a coldness index page.

The sequencer 19 can control an operation of the cold data region 102 based on the coldness information. The coldness information is information such as a voltage that is used during reading of the data or during writing of the data. For example, the coldness information in the memory system of the embodiment is a correction amount of the voltage that is used in the shift read.

In addition, the coldness information may include information (hereinafter, referred to as determination information) for determining whether or not a refresh operation for the cold data region 102 is necessary or reliability (presence or absence of destruction of data) of data within the cold data region 102.

For example, "0" data is written as the determination information within a portion of region (one or more memory cells) within the coldness index page. In this case, a threshold voltage of the memory cell, in which the "0" data is written, is higher than a value corresponding to an erased state.

The threshold voltage of the memory cell in which the "0" data is written indicates a tendency of the memory cell to change to a lower level (threshold voltage corresponding to the erased state) as time elapses. When the threshold voltage of the memory cell is equal to or less a level (reading level) for determination of the "0" data by the elapsed time, data read from the memory cell becomes "1" data.

Therefore, when reading information for the coldness index page, the number of the "1" data within the region in which the determination information is stored is counted and then the sequencer 19 or the memory controller 200 can predict a degree of deterioration of the data within the cold data region 102. As a result, the sequencer 19 or the memory controller 200 can obtain information whether or not the refresh operation for the cold data region 102 is necessary and reliability of data within the cold data region 102.

In addition, the coldness information may be stored within the memory cell (memory cell MCB positioned on the most bit line side) of the highest layer of the NAND string 111. In addition, the coldness information may be stored within the memory controller 200.

In the embodiment, as illustrated in FIG. 1, if the flash memory 201 includes the multiple memory chips 2, the entire memory cell array 10 within a certain memory chip may be set in the cold data region 102.

In the embodiment, physical structures of the normal data region 101 and the cold data region 102 are substantially the same as each other. Thus, a portion of the normal data region 101 may be used as the cold data region 102 in accordance with the control from the host device 99 or the memory controller 200. In addition, the cold data region 102 may be used as the normal data region 101 in accordance with the control from the host device 99 or the memory controller 200. As described above, the flash memory 201 of the embodiment can flexibly execute conversion from the normal data region 101 to the cold data region 102 and conversion from the cold data region 102 to the normal data region 101.

In addition, one memory cell MCB may include three or more memory transistors within the cold data region 102. In this case, one or more page addresses are assigned in the word line set including three or more word lines WLk, WLk+1, WLk+2, . . . .

As described above, in the flash memory of the embodiment, the second memory cell MCB within the second region (cold data region) 102 of the memory cell array 10 includes two or more memory transistors MT.

An effective area of the memory film 79 within the second memory cell MCB is greater than an effective area of the memory film 79 within the first memory cell MCA. Therefore, an amount of electrons that can be stored in the memory film 79 of the second memory cell MCB is greater than an amount of electrons that can be stored in the memory film 79 of the first memory cell MCA.

In the second memory cell MCB, a portion of the memory film facing the interlayer insulating film between the pluralities of the control gate electrodes (word lines) also holds the data of the memory cell MCB.

Thus, for the memory cell MCB within the second region 102, it is possible to reduce a leakage amount of electrons from the memory film 79 with respect to a total amount of electrons stored within the memory cell MCB.

Furthermore, in the memory cell MCB, since substantially the same threshold voltage (charge holding state) is provided in the multiple memory transistors MT, movement of charge with respect to a portion of the memory film facing the interlayer insulating film is reduced.

Thus, it is possible to suppress a change of the data in association with the threshold voltage of the memory cell MCB.

As a result, the retention characteristics of the second memory cell MCB are higher than the retention characteristics of the first memory cell MCA.

As described above, the memory system according to the embodiment can improve the retention characteristics of the data of the three-dimensional flash memory.

b) Operation Example

An operation example (control method) of the memory system according to the embodiment will be described with reference to FIGS. 6 to 15.

Hereinafter, the memory system according to the embodiment will be described in a case where the memory cell MCB of the cold data region 102 of the flash memory 201 is the SLC.

b-1) Writing Operation

An writing operation of the memory system according to the embodiment will be described with reference to FIGS. 6 and 7. Here, writing of the data with respect to the cold data region of the flash memory will be described.

Figure 6:
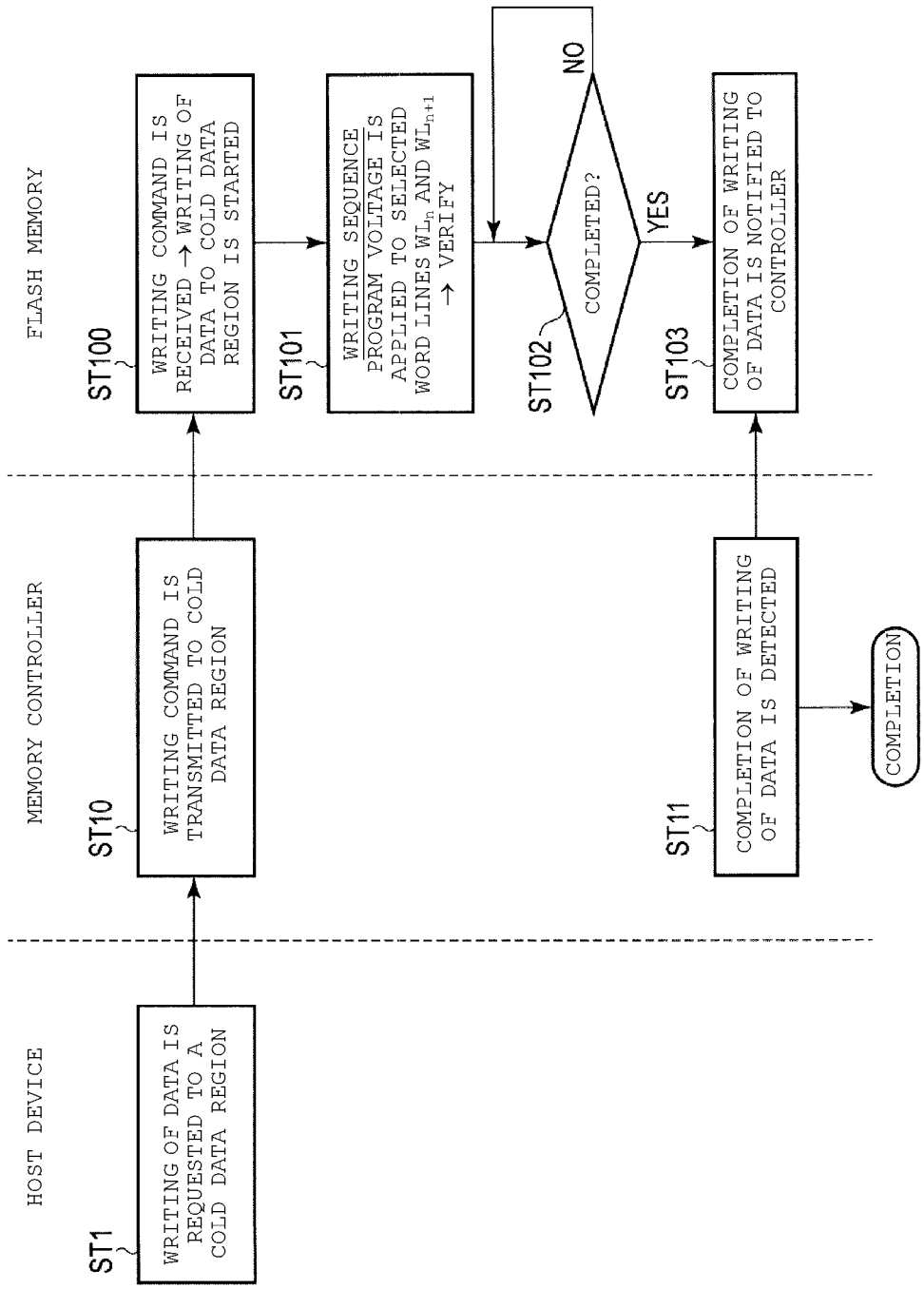
FIG. 6 is a flowchart of a writing operation example of the memory system of the embodiment.

As illustrated in a flowchart of FIG. 6, the host device 99 requests writing to the cold data region 102 of the flash memory 201 from the storage device 1 (step ST1). For example, the host device 99 specifies the cold data region 102 as the writing region of the data based on a type (for example, an extension of the data to be written) of the data to be written, an instruction of a user, and the like.

In addition, the host device 99 transmits the data to be written to the memory controller 200.

Figure 7:
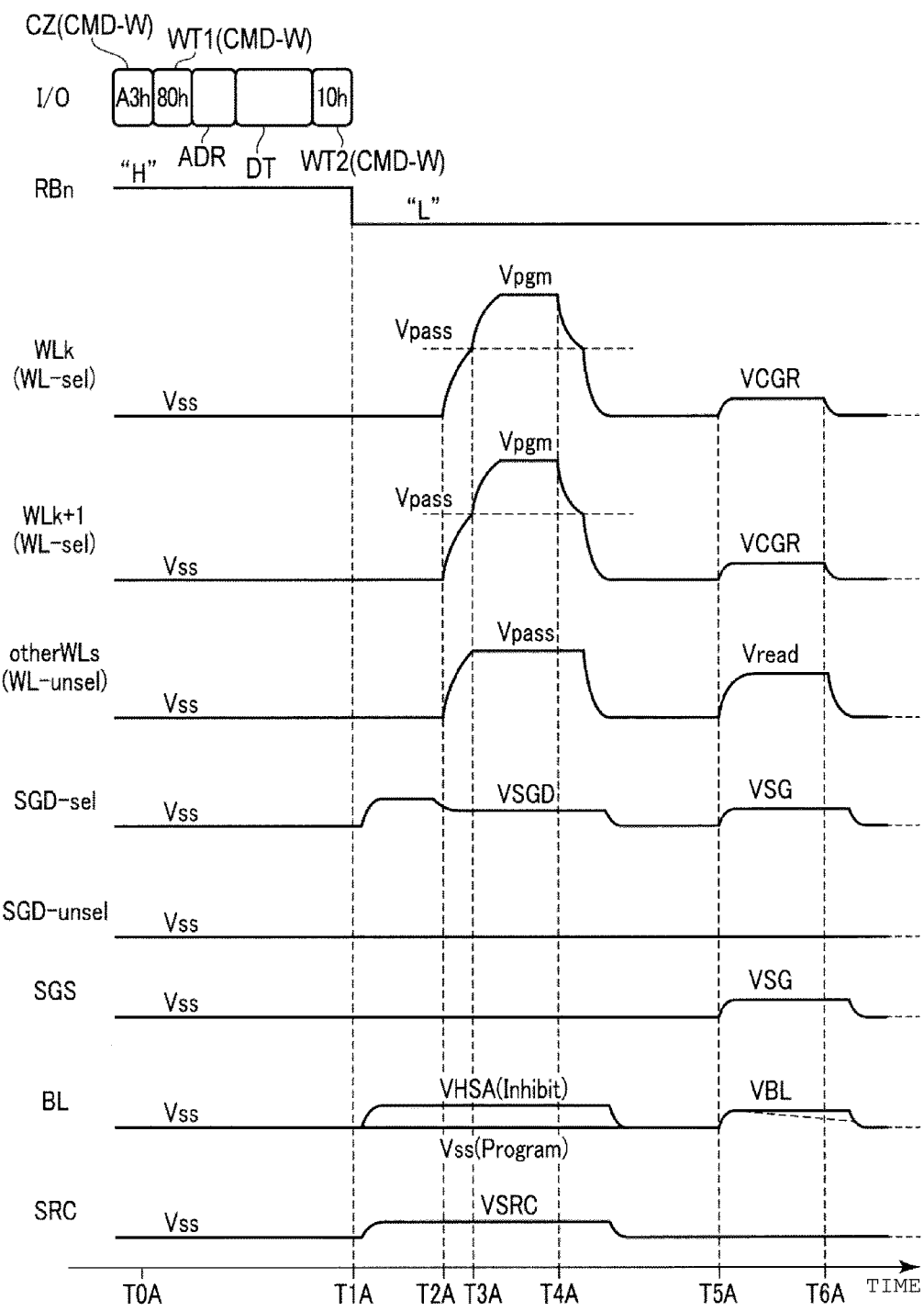
FIG. 7 is a timing chart of the writing operation example of the memory system according to the embodiment.

As illustrated in a timing chart of FIG. 7, at time TOA, the memory controller 200 transmits a writing command CMD-W to the flash memory 201 of the embodiment via an input and output line I/O as a command for executing the request from the host device 99 (step ST10).

The writing command CMD-W of the flash memory includes at least a first writing command signal (80$h$) WT1 and a second writing command signal (10$h$) WT2.

In the embodiment, as illustrated in the timing chart in FIG. 7, when writing the data to the cold data region 102, the memory controller 200 issues the writing command CMD-W including a first signal (A3$h$) CZ. Hereinafter, in order to distinguish the configuration elements, the first signal CZ is referred to as a mode signal CZ.

In the mode signal (A3$h$) CZ, a region within the memory cell array 10 that is the operation target is indicated to be the cold data region 102. The fact that an operation mode to be executed by a command by transmitting and receiving a signal is an operation mode with respect to the cold data region 102 is notified to the flash memory 201.

For example, the memory controller 200 transmits the mode signal CZ to the flash memory 201 before the first writing command signal WT1.

The memory controller 200 transmits an address (selected address) ADR of a page to which data is written after transmission of the mode signal CZ and the first writing command signal WT1.

The memory controller 200 transmits data DT to the flash memory 201 following the address ADR. For example, the memory controller 200 gives parity to the flash memory for the data to be written by the ECC circuit 260.

After transmission of the data DT, the memory controller 200 transmits the second writing command signal WT2 to the flash memory 201.

The flash memory 201 receives the command CMD-W and starts an operation (step ST100). At time T1A, the sequencer 19 a signal level of the ready and busy signal RBn transitions from an H level to a L level and notifies the start of the operation to the memory controller 200.

The sequencer 19 interprets the mode signal CZ and the command signals WT1 and WT2. Thus, the sequence 19 recognizes an instruction from the memory controller 200 as writing of data to the cold data region 102.

The sequencer 19 executes one or more writing loops in the writing sequence of the data of the flash memory 201 (step ST101). The writing loop includes one or more program steps (program operation) and one or more verification steps (verify operations).

The sequencer 19 controls each circuit within the flash memory 201 so as to execute the program steps with respect to the cold data region 102.

The charge pump 17 generates various voltages that are used in writing of the data.

The well driver 15 controls a potential of the p-type well region 192.

The source line driver 14 applies the voltage VSRC to the source line SRC.

The sensing circuit 13 controls a potential of the bit line BL in accordance with the data to be written.

Here, a writing cell and a writing prohibited cell are connected to the selected word lines WLk and WLk+1. The writing cell is a memory cell in which the threshold voltage is shifted. The writing prohibited cell is a memory cell in which the threshold voltage is not shifted.

The sensing circuit 13 applies a voltage Vss to the bit line BL connected to the writing cell. The sensing circuit 13 applies a voltage VHSA that is greater than 0 V to the bit line BL connected to the writing prohibited cell.

The row decoder 12 applies a voltage VSGD to the selected drain-side select gate line SGD-sel within the selected string unit SU.

Thus, for the writing cell, the bit line BL is electrically connected to the semiconductor pillar SP via the drain-side select transistor ST1 in a state of being turned on.

On the other hand, for the writing prohibited cell, the transistor ST1 is cut off by the potential VHSA of the bit line BL and the gate voltage VHSA of the drain-side select transistor ST1.

The row decoder 12 applies the voltage Vss to a non-selected drain-side select gate line SGD-unsel.

The row decoder 12 applies the voltage Vss to the source-side select gate line SGS of the selected string unit SU.

At time T2A, the row decoder 12 applies a non-selected voltage (writing pass voltage) Vpass to a non-selected word line WL.

The row decoder 12 selects a page within the cold data region 102 indicated by the selected address ADR. For example, the selected address ADR indicates an address of one word line in the word line set connected to the memory cell MCB. If the sequencer 19 receives the mode signal CZ, the sequencer 19 controls the row decoder 12 so as to select the word line WLk and the word line WLk+1 adjacent to the word line WLk indicated by the selected address ADR based on the selected address ADR.

Thus, as illustrated in FIG. 7, in the embodiment, the row decoder 12 activates two word lines WLk and WLk+1 corresponding to the selected address ADR by control of the sequencer 19.

The row decoder 12 applies the writing pass voltage Vpass to the selected word lines WLk and WLk+1 simultaneously when the voltage Vpass is applied to non-selected word line other WLs. Thereafter, at time T3A, the row decoder 12 increases the potential of the selected word lines WLk and WLk+1 from the writing pass voltage Vpass to a program voltage Vpgm.

Thus, for the memory cell MCB connected to the selected word lines WLk and WLk+1 in the cold data region 102, electrons are injected into the memory film 79 of the writing cell (memory transistor MT). The threshold voltage of the writing cell is shifted in a positive direction. On the other hand, in the writing prohibited cell, channel boost of the memory transistor MT is performed by cut-off of the drain-side select transistor ST1. Therefore, injection of electrons into the writing prohibited cell is suppressed.

In the embodiment, the charge is also injected into a portion of the memory film 79 corresponding to the interlayer insulating film 89 interposed between the selected word lines WLk and WLk+1 by a composite electric field of the program voltage Vpgm applied to the two selected word lines WLk and WLk+1 in addition to a portion of the memory film 79 facing the selected word line during applying the program voltage.

After application of the program voltage Vpgm, at time T4A, the sequencer 19 controls the operation of each circuit so as to complete the program steps. Thus, the potential of each of wiring WL, BL, SGD, and SGS is set as the voltage Vss.

The sequencer 19 executes the verify step (program verify) after the program steps. The sequencer 19 determines whether or not the threshold voltage of the selected cell MCB belongs within the threshold voltage distribution (threshold state) corresponding to data to be stored by the verify step.

At time T5A, the sensing circuit 13 applies a voltage VBL of a certain size to the bit line BL.

The row decoder 12 transfers the voltages VSGD and VSGS to the select gate lines SGS and SGD, and turns on the select transistors ST1 and ST2.

The row decoder 12 applies a non-selected voltage (reading pass voltage) Vread to the non-selected word line otherWLs.

The row decoder 12 applies a verify voltage Vvf to the two selected word lines WLk and WLk+1.

If the selected cell MCB is turned on by application of the verify voltage Vvf, a current is generated in the bit line BL connected to the selected cell of a state of being turned on and a potential of a node connected to the bit line BL is decreased. The sensing circuit 13 detects generation (decrease in the potential of the node) of the current of the bit line BL. As a result, the selected cell MCB connected to the bit line BL, in which the current is generated, is determined as a verification fail.

If the selected cell is turned off during applying the verify voltage Vvf, the current is not generated in the bit line BL connected to the selected cell of the state of being turned off and the potential of the node connected to the bit line is maintained. The sensing circuit 13 detects non-generation (maintenance of the potential of the node) of the bit line BL. As a result, the selected cell MCB connected to the bit line BL in which the current is not generated is determined as a verify pass.

After the sense operation with respect to the bit line BL, at time T6A and following, the sequencer 19 sequentially sets a potential of each wire to be the voltage Vss.

The sequencer 19 determines whether or not writing of the data is completed based on a verify result (step ST102).

If the selected cell MCB of the verify fail is present within the selected page, the program steps are executed again. In the program step after the verify step, for example, a voltage value of the program voltage Vpgm is increased.

The writing loop is repeatedly executed until entire memory cells MCB within the selected page become the verify pass.

The entirety of the memory cells of the selected page become the verify pass and then writing of the data is completed.

When writing of the data is completed, the sequencer 19 transitions the signal level of the ready and busy signal RBn from the L level to the H level.

Thus, the flash memory 201 (sequencer 19) notifies the completion of writing of the data to the cold data region 102 to the memory controller 200 (step ST103).

The memory controller 200 detects the completion of writing of the data of the flash memory 201 based on the notification from the flash memory 201 (step ST11).

As described above, writing of the data of the flash memory 201 to the cold data region 102 is completed.

In addition, the sequencer 19 may determine whether or not writing of the data to the cold data region 102 is performed based on the selected address ADR or the flag from the memory controller 200 without addition of the mode signal CZ with respect to the command CMD-W.

As described above, the memory system (storage device) according to the embodiment can execute writing of the data to the memory cell MCB within the cold data region 102.

b-2) Reading Operation

A reading operation of the memory system according to the embodiment will be described with reference to FIGS. 8 and 9. Here, reading of the data from the cold data region of the flash memory will be described.

Figure 8:
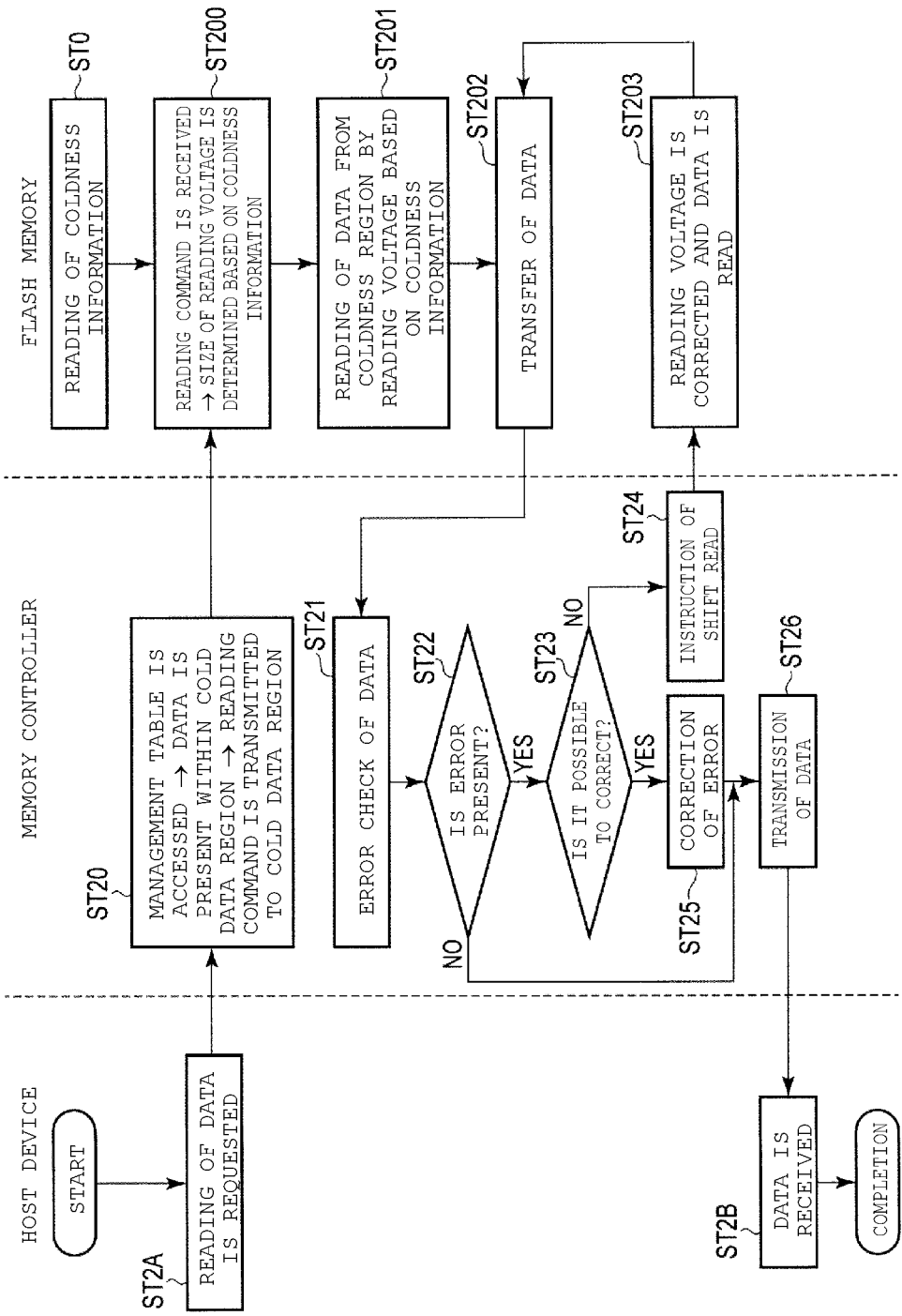
FIG. 8 is a flowchart of a reading operation example of the memory system according to the embodiment.

As illustrated in a flowchart in FIG. 8, the flash memory 201 reads the coldness information from the coldness index page within the cold data region 102, for example, when power is turned on (timing before receiving the reading command) (step ST0). The coldness information is held within the register 18. In addition, reading of the coldness information may be executed during executing the reading operation (receiving of the command).

The host device 99 requests reading of certain data (step ST2A).

If reading of the data is requested from the host device 99, the memory controller 200 refers to the management table (for example, logical-physical table) TBL. The storage region of the data requested from the host device 99 is searched.

Therefore, the memory controller 200 detects that the data is present within the cold data region 102 of the flash memory 201.

Figure 9:
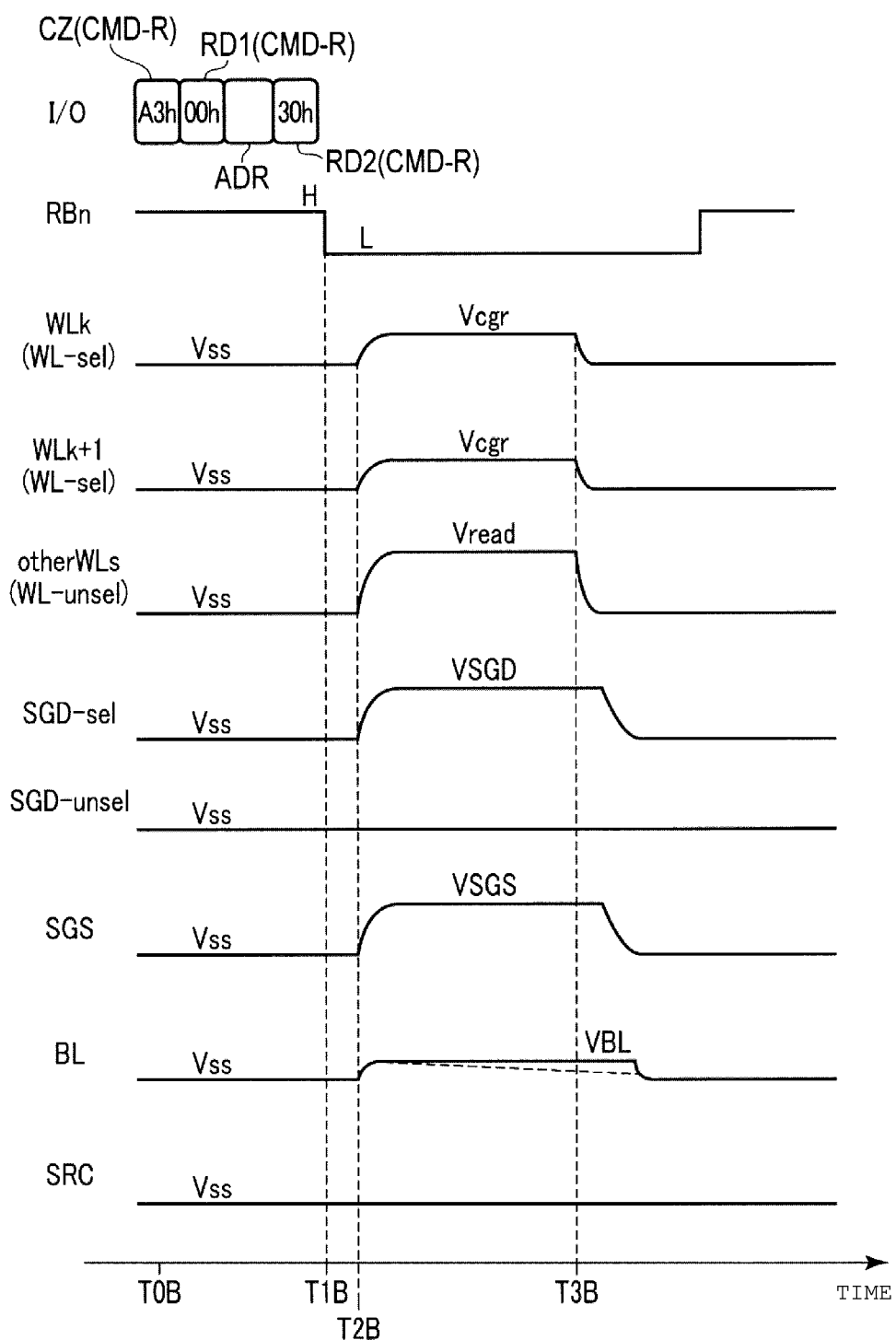
FIG. 9 is a timing chart of the reading operation example of the memory system according to the embodiment.

As illustrated in a timing chart in FIG. 9, at time TOB, the memory controller 200 transmits a reading command CMD-R and the selected address (reading address) ADR to the flash memory 201 based on the management table TBL (step ST20).

The reading command CMD-R includes a first reading command signal (00*h*) RD1 and a second reading command signal (30*h*) RD2.

If the data requested from the host device 99 is present within the cold data region 102, the memory controller 200 transmits the mode signal CZ to the flash memory 201 to indicate that the target of the reading operation is the cold data region 102.

The memory controller 200 sequentially transmits the mode signal CZ, the first reading command signal RD1, the selected address ADR, and the second reading command signal RD2 to the flash memory 201.

The flash memory 201 receives the command CMD-R and the address ADR (step ST200). At time T1B, the sequencer 19 sets a signal level of the ready and busy signal RBn to the L level and notifies the memory controller 200 of starting of the reading operation.

The sequencer 19 interprets the command CMD-R. The sequencer 19 recognizes that an operation requested from the memory controller 200 is reading of the data from the cold data region 102 by the mode signal CZ and the command signals RD1 and RD2.

The sequencer 19 executes reading of the data to the cold data region 102 (step ST201).

The sequencer 19 converts an address from the selected address ADR to the two selected word lines WLk and WLk+1 based on the mode signal CZ (or flag).

The sequencer 19 determines a reading voltage Vcgr based on the coldness information. The reading voltage Vcgr includes a size that is obtained by adding or subtracting a certain voltage value (corrected voltage value V2) with respect to a default voltage value (initial setting voltage V1) based on the coldness information.

The charge pump 17 generates various voltages that are used in reading of the data by control of the sequencer 19 based on the coldness information.

At time T2B, the sensing circuit 13 applies the voltage VBL to the bit line BL. The well driver 15 applies a voltage having a certain magnitude to the well region.

The row decoder 12 applies the voltage VSGD to the selected drain-side select gate line SGD-sel and applies the voltage Vss to the non-selected drain-side select gate line SGD-unsel.

The row decoder 12 applies the voltage VSGS to the selected source-side select gate line SGS. The row decoder 12 applies the reading pass voltage Vread to the non-selected word line otherWLs.

The row decoder 12 selects a page within the cold data region 102 corresponding to the selected address ADR.

The row decoder 12 applies the reading voltage Vcgr in which the coldness information is reflected, to the two word lines WLk and WLk+1. For example, in reading of the data from the SLC, the reading voltage Vcgr includes a certain determined voltage value (for example, V1+V2).

In addition, regarding reading of the data from the cold data region 102, the reading voltage Vcgr is applied to one selected word line WLk and the reading pass voltage Vread may be applied to the other word line WLk+1 in the two selected word lines WLk and WLk+1. In this case, the cold data region 102 is selected by the mode signal CZ and one word line WLk may be selected by the selected address ADR without a change in the selected address ADR by the sequencer 19.

The memory cell MCB including the threshold voltage equal to or less than the determined voltage value in the multiple selected cells that are connected to the selected word lines WLk and WLk+1 is turned on by application of the reading voltage Vcgr. On the other hand, the memory cell MCB including the threshold voltage greater than the determination voltage value in the multiple selected cells is turned off.

During the reading operation, similar to program verify, the sensing circuit 13 detects presence or absence of generation (or decrease in the potential of the node) of the current in the bit line BL.

A detected result (signal of the H level or the L level) regarding the bit line BL by the sensing circuit 13 is output to the page buffer 131. The page buffer 131 temporarily holds the signal based on the detected result as data that is read from the selected page.

At time T3B and following, the potential of each wire such as the selected word lines WLk and WLk+1, and the bit line BL is set as the voltage Vss by the sequencer 19.

The sequencer 19 transfers data within the page buffer 131 to the memory controller 200 (step ST202).

For example, the memory controller 200 executes error check with respect to the data from the flash memory 201 by the ECC circuit 260 (step ST21).

The ECC circuit 260 determines whether or not an error is present in the data from the flash memory 201 based on a syndrome generated from parity (step ST22).

If the ECC circuit 260 determines that the error is not present within the data, the memory controller 200 transmits the data to the host device 99 (step ST26).

If the ECC circuit 260 determines that the error is present within the data, the ECC circuit 260 determines whether or not the error can be corrected (step ST23).

If the ECC circuit 260 determines that correction of the error is impossible, the memory controller 200 transmits a command or a control signal to execute a shift read process to the flash memory 201 (step ST24).

The sequencer 19 executes the shift read process based on the instruction from the memory controller 200 (step ST203).

The sequencer 19 determines a reading voltage (hereinafter, referred to as shift reading voltage Vcgrz) that is used in the shift read process based on setting information and the coldness information. The shift reading voltage Vcgrz is obtained by adding or subtracting a certain voltage value V3 with respect to a voltage value V2 of a previous reading voltage.

The sequencer 19 executes reading of the data using the shift reading voltage Vcgrz.

In addition, in the shift read process, the voltage variation of the voltage applied to the selected word lines WLk and WLk+1 is different from that of the operation of FIG. 9 and other controls of wiring in the shift read process are substantially the same as the operation illustrated in FIG. 9.

Data read by the shift read process is transferred to the memory controller 200. The memory controller 200 performs the process of step ST21 to step ST23 with respect to the data read by the shift read process.

If the ECC circuit 260 determines that the correction of the error within the data is possible, the memory controller 200 corrects the error within the data by the ECC circuit 260 (step ST25). The memory controller 200 transmits the data in which the error is corrected to the host device 99 (step ST26).

The host device 99 receives the data from the memory controller 200 (step ST2B).

In addition, if the correction of the error of the data is impossible even after the shift read process is executed for several times, the memory controller 200 notifies that requested data includes a correction impossible error to the host device 99.

Reading of the data in the memory system according to the embodiment is completed.

In the memory system according to the embodiment, the magnitude of the reading voltage Vcgr with respect to the cold data region 102 is controlled based on information within the cold data region 102. Thus, the memory system according to the embodiment can reduce the number of times of the shift read. As a result, the memory system according to the embodiment can shorten time for reading of the data and to efficiently perform the reading operation.

In addition, presence or absence of the shift read process and a result of the shift read process may be reflected to setting conditions of the coldness information, the status of the flash memory, and the reading operation after reading of the data. Thus, various voltages (for example, the reading voltage) that are used in the reading operation and the shift read process are adjusted.

As described above, the memory system (storage device 1) according to the embodiment can execute reading of the data from the memory cell MCB within the cold data region 102.

b-3) Erasing Operation

An erasing operation of the memory system according to the embodiment will be described with reference to FIGS. 10 and 11. Here, erasing of the data to the cold data region of the flash memory will be mainly described.

Figure 10:
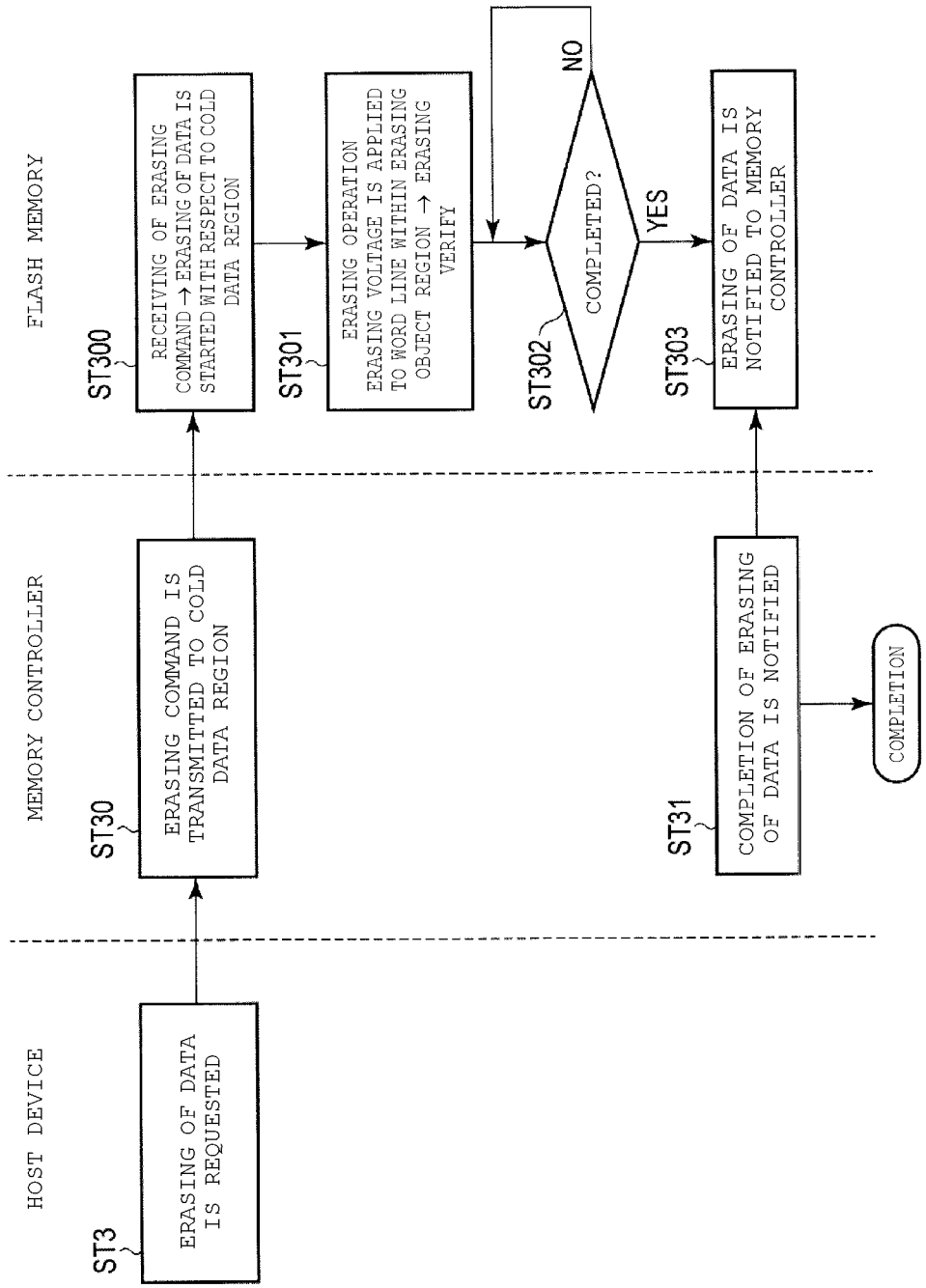
FIG. 10 is a flowchart of an erasing operation example of the memory system according to the embodiment.

As illustrated in a flowchart of FIG. 10, the host device 99 requests erasing of the data (step ST3).

The memory controller 200 detects a region in which data to be erased is stored is present within the cold data region 102 based on the management table TBL.

Figure 11:
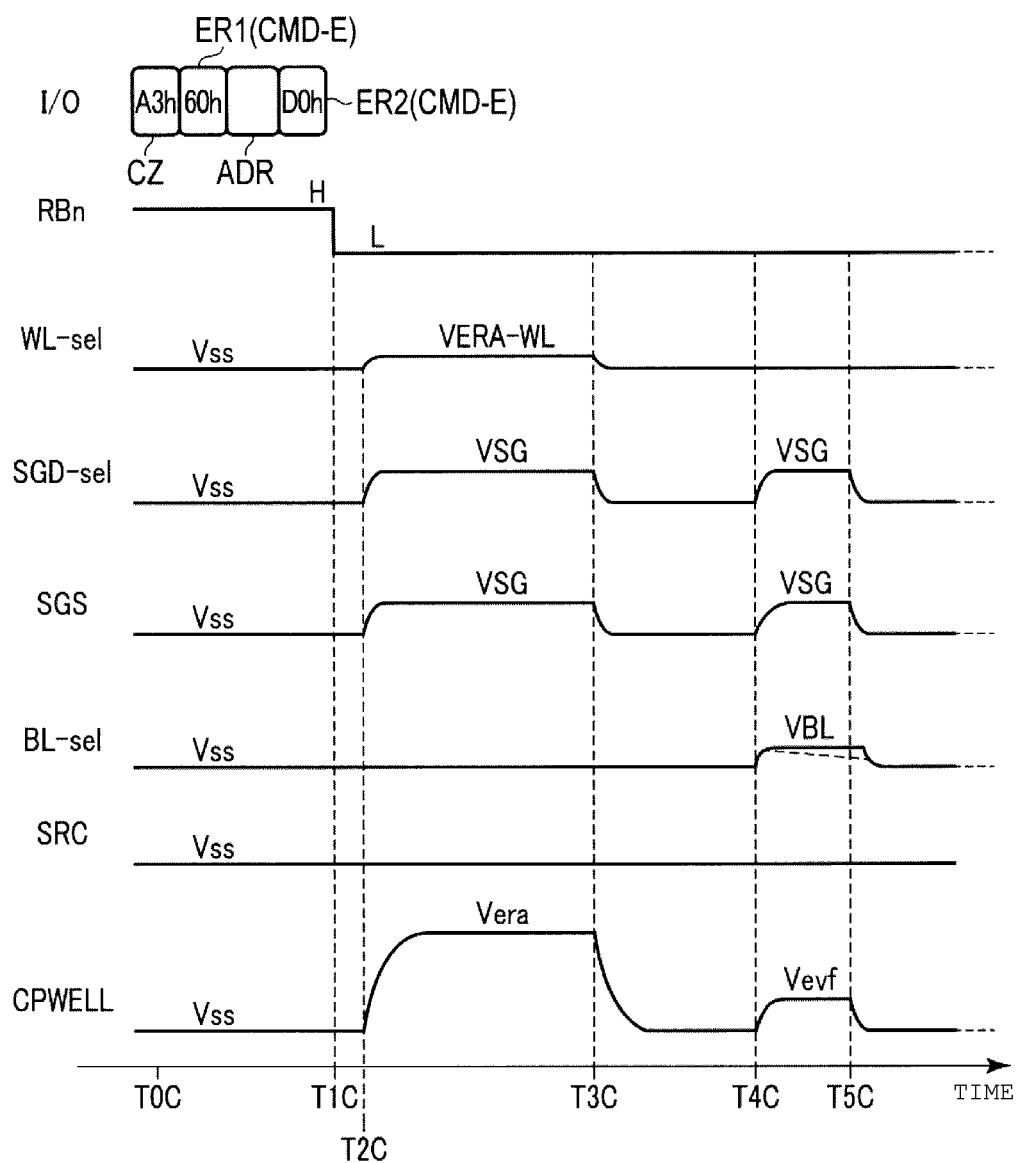
FIG. 11 is a timing chart of an erasing operation example of the memory system according to the embodiment.

As illustrated in a timing chart of FIG. 11, at time T0C, the memory controller 200 transmits an erasing command CMD-E for executing the erasing operation in the cold data region 102 to the flash memory 201 (step ST30).

The command CMD-E includes the mode signal CZ indicating that a target of the erasing operation is in the cold data region 102 together with a first and second erasing command signal ER1 and ER2.

The memory controller 200 transmits, for example, signals of the mode signal CZ, the first erasing command signal (60h) CE1, the selected address ADR, and the second erasing command signal (D0h) CE2 to the flash memory 201 in this order.

The flash memory 201 receives the erasing command CMD-E (step ST300). At time T1C, the sequencer 19 transits the signal level of the ready and busy signal RBn to the L level and notifies the memory controller 200 of starting of an operation.

The sequencer 19 interprets the erasing command CMD-E. The sequencer 19 recognizes that the target of erasing of the data is in the cold data region 102 by the mode signal CZ.

The sequencer 19 controls each circuit within the flash memory 201 so as to execute the erasing operation in the cold data region 102 (step ST301).

The charge pump 17 generates various voltages that are used in erasing of the data.

At time T2C, the row decoder 12 applies the voltage VSG to the select gate lines (for example, entire select gate lines within the block) SGD-sel and SGS within the cold data region 102 to the voltage VSG.

The row decoder 12 applies the voltage Vss to the selected word line (entire word lines within the block) WL-sel within the cold data region 102.

The sensing circuit 13 applies the voltage Vss to entire bit lines BL-sel within a target region of erasing of the cold data region 102. The source line driver 14 applies the voltage Vss to the source line SRC.

The well driver 15 applies an erasing voltage Vera to the well contact CPWELL. Thus, the erasing voltage Vera is applied to the semiconductor pillar SP via the p-type well region 192.

Electrons within the memory film 79 are opened to the semiconductor pillar SP or a positive hole is injected into the memory film 79 by a potential difference between the word line WL-sel and the semiconductor pillar SP. Thus, the threshold voltage of the memory cell MCB is shifted in a negative direction.

At time T3C, the potential of each wiring such as the selected word lines WLk and WLk+1 is set as the voltage Vss.

After application of the erasing voltage Vera, erasing verify is executed.

At time T4C, the sensing circuit 13 applies the voltage VBL to the bit line BL-sel. The row decoder 12 applies the voltage Vss to the word line WL-sel and applies the voltage VSG to the select gate lines SGD-sel and SGS within the cold data region 102. The well driver 15 applies a verify voltage Vevf to the well contact CPWELL.

Thus, during erasing verify in the cold data region 102, the memory cell MCB is turned on or off in accordance with the threshold voltage of the memory cell MCB. As a result of turning on/off of the memory cell MCB, in the bit line BL-sel within the block, a bit line in which a current is generated and a bit line (node in which a potential is varied and a node in which the potential is maintained) in which the current is not generated are present.

The sensing circuit 13 detects the current of the bit line BL-sel. In erasing verify, if it is a verify pass, the current is generated in the bit line BL-sel and if it is a verify fail, the current is not generated in the bit line BL-sel.

Thereafter, at time T5C and following, the potential of each wiring such as the selected word lines WLk and WLk+1 is set as the voltage Vss.

The sequencer 19 determines whether or not erasing of the data is completed based on a result of erasing verify (step ST302).

If the bit line indicating the verify fail is detected, application of erasing voltage and erasing verify are repeatedly executed until entire bit lines BL indicate the verify pass.

If the entire bit lines BL indicate the verify pass, erasing of the data with respect to the cold data region 102 is completed.

For example, the flash memory 201 notifies that erasing of the data to the cold data region 102 is completed to the memory controller 200 by the ready and busy signal RBn of the H level (step ST303).

Thus, the memory controller 200 detects that erasing of the data to the cold data region 102 is completed (step ST31).

As described above, erasing of the data to the cold data region of the flash memory in the memory system according to the embodiment is completed.

In addition, erasing of the data to the cold data region 102 (and the normal data region 101) may be executed in units (storage region) smaller than the block, and the erasing operation of the flash memory as described in "NONVOLATILE SEMICONDUCTOR STORAGE APPARATUS AND MANUFACTURING METHOD THEREOF" of U.S. patent application Ser. No. 12/679,991, filed on Mar. 25, 2010 and "SEMICONDUCTOR MEMORY AND MANUFACTURING METHOD THEREOF" of U.S. patent application Ser. No. 12/532,030, filed on Mar. 23, 2009 may be used. The entire contents of these applications are incorporated by reference herein.

As described above, the memory system (and storage device) according to the embodiment can execute erasing of the data of the memory cell MCB within the cold data region 102.

b-4) Internal Transfer of Data

Internal transfer of the data within the flash memory in the memory system according to the embodiment will be described with reference to FIGS. 12 to 15.

The data within the flash memory 201 includes the data stored within the normal data region 101, but such data may become cold data in accordance with a usage status of the user.

The memory system according to the embodiment can transfer (relocate) the data of which the access frequency is low within the normal data region 101 to the cold data region 102.

The memory system according to the embodiment can count, for example, the number of accesses with respect to the normal data region 101. In the memory controller 200, the CPU 230 counts the number of accesses with respect to each address and stores a result of the count in the storage region within the RAM 220 or the CPU.

Figures 12, 13:
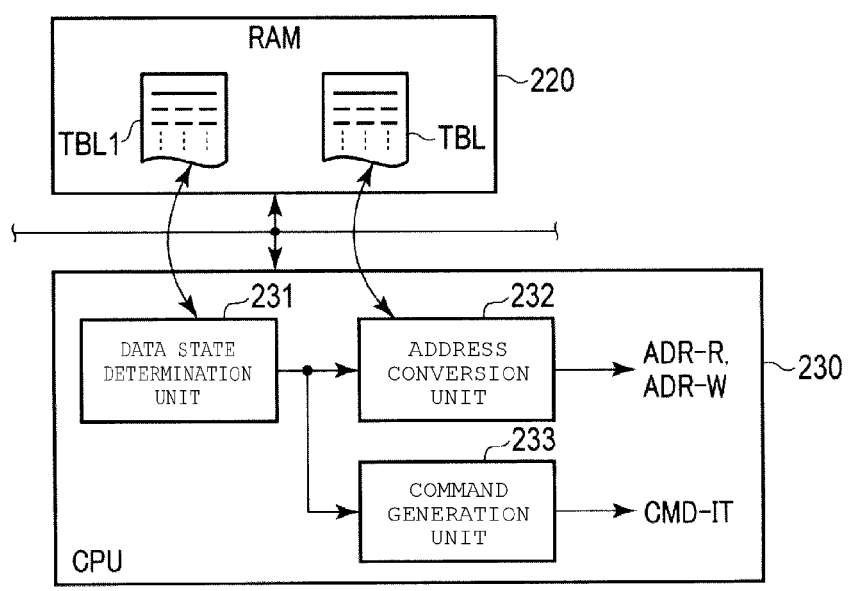
FIG. 12 is a management table that is used during an internal operation example of the memory system according to the embodiment.
FIG. 13 is a diagram illustrating an internal operation example of the memory system according to the embodiment.

For example, the memory system according to the embodiment manages a page (data) within the normal data region 101 by using a management table TBL1 illustrated in FIG. 12.

The addresses (for example, the page addresses) within the normal data region 101 and the number of accesses (for example, the number of times of reading of the data) to the addresses x0, x1, . . . , the xa, xb, . . . are recorded in the management table (hereinafter, referred to as access frequency management table) TBL1 of FIG. 12.

For example, a date and time tw0, tw1, . . . , twa, twb, . . . , when the data is written in the page and a date and time (for example, a date and time when the final data is read) tr0, tr1, . . . , tra, trb, . . . are recorded in the table TBL1.

The memory controller 200 can determine whether or not the data stored in the address is the cold data based on the number of accesses with respect to the page address within the normal data region 101 and an interval from the date and time of the final accesses to the current date and time.

If power is cut off from the storage device 1 (if the storage device is turned off), the access frequency management table TBL1 is stored within the flash memory 201. When power to the storage device 1 is supplied, the table TBL1 is read from the flash memory 201 to the memory controller 200. If power is supplied to the storage device 1 (the storage device is turned on), the table TBL1 is stored within the work memory 220 of the memory controller 200. The management table TBL1 may also be supplied from the host device 99 to the memory controller 200.

As illustrated in a block diagram of FIG. 13, the memory controller 200 includes a data state determination unit 231, an address conversion unit 232, and a command generation unit 233. Thus, the memory controller 200 instructs data transfer within the flash memory 201 by using the table TBL1.

For example, the data state determination unit 231, the address conversion unit 232, and the command generation unit 233 are provided within the CPU 230. These configurations 231, 232, and 233 may be supplied as circuit blocks or may be supplied as firmware and software.

The data state determination unit 231 determines whether or not the data within the normal data region 101 is in the cold state with reference to the table TBL1 within the RAM 220.

The address conversion unit 232 converts the address of the normal data region 101 into the address of the cold data region 102 by using the management table (for example, file allocation table) TBL.

The command generation unit 233 generates a command (or control signal) based on a determination result of the data state determination unit 231 so that the data transfer is executed between the normal data region 101 and the cold data region 102 within the flash memory.

In addition, the data state determination unit 231 can detect the access frequency of the data within the cold data region 102 with reference to the access frequency management table regarding the cold data region 102. In addition, the address conversion unit 232 can convert the address of the cold data region 102 into the address of the normal data region 101.

The data transfer between the normal data region 101 and the cold data region 102 within the flash memory 201 is executed as follows.

For example, the data transfer between the normal cold data regions 101 and 102 is executed during a period of a state in which the flash memory 201 does not execute an operation requested from the host device 99 (for example, a standby state).

Figure 14:
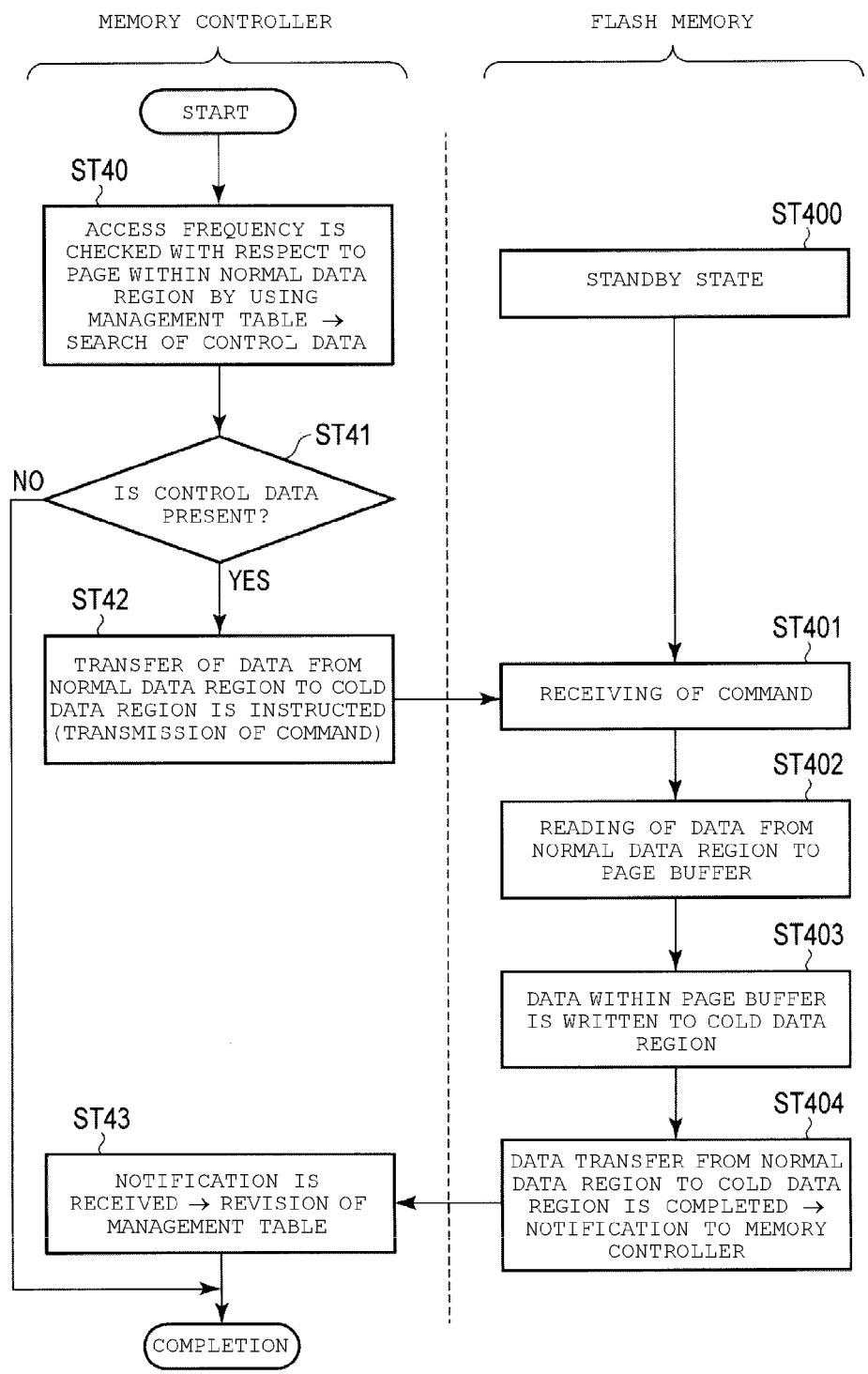
FIG. 14 is a flowchart of the internal operation example of the memory system according to the embodiment.

As illustrated in a flowchart in FIG. 14, the memory controller 200 refers the table TBL1 during the standby state (step ST400) of the flash memory (step ST40).

The memory controller 200 determines whether or not data that is considered as the cold data is present within the normal data region 101 (step ST41).

For example, the data state determination unit 231 refers the table TBL1 and checks the access frequency to the page within the normal data region 101. The data state determination unit 231 searches the data having the cold state within the normal data region 101.

If the memory controller 200 detects the data that is considered to be cold data based on the table TBL1, the memory controller 200 instructs internal transfer of the data to the flash memory 201 (step ST42). For example, for instruction of the internal transfer of the data, the memory controller 200 sequentially transmits the reading command and the reading address to the normal data region 101, and the writing command and the writing address to the cold data region 102 at timing synchronized with an internal operation of the flash memory 201.

For example, if the data of the cold state is present within the normal data region 101, the data state determination unit 231 notifies the address of the data of the cold state to the address conversion unit 232. In addition, the data state determination unit 231 notifies information of the data that is considered as the cold state such as the size of the data to the address conversion unit 232 in addition to the data address that is considered as the cold state.

The address conversion unit 232 converts the address from the data state determination unit 231 into an address of transfer destination of the data within the cold data region 102 based on various pieces of information (address and the like) from the data state determination unit 231 and the management table (for example, the address management table) TBL. Thus, the writing address is generated by using the internal transfer of the data.

For example, the address conversion unit 232 sequentially transmits the writing address (address of a transfer source of the data) ADR-R of the data within the normal data region 101 and the writing command ADR-W of the data within the cold data region 102 to the flash memory 201 at timing corresponding to the internal operation of the flash memory 201.

In addition, the command generation unit 233 issues a command CMD-IT and transmits the command CMD-IT to the flash memory 201 so that the data read from the normal data region 101 is written within the cold data region 102 by an internal process within the flash memory 201 based on a detection result of the data state determination unit 231.

In addition, a command executing the internal transfer of the data within the flash memory 201 may be generated by combining the writing command and the reading command described above.

The flash memory 201 receives the command CMD-IT (step ST401).

Figure 15:
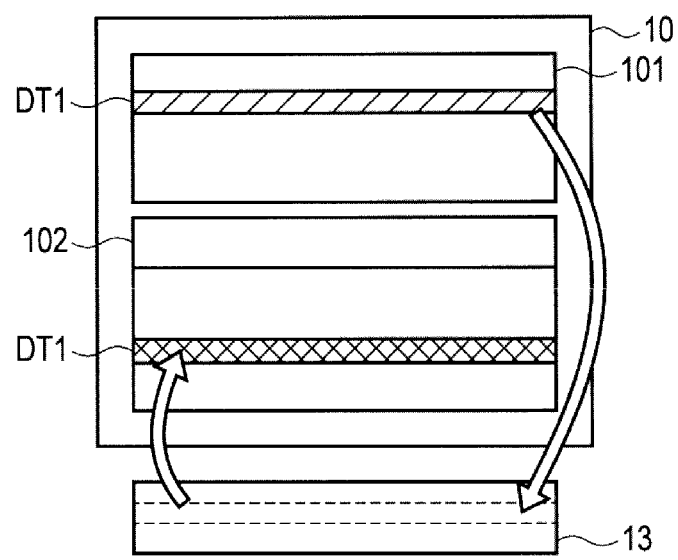
FIG. 15 is a conceptual diagram illustrating the internal operation example of the memory system according to the embodiment.

As illustrated in a schematic diagram in FIG. 15, the sequencer 19 reads data (cold data) from a reading address ADR-R of the normal data region 101 to the page buffer 131 within the flash memory 201 by the command CMD-IT (step ST402).

The sequencer 19 writes the data within the page buffer 131 to a writing address ADR-W within the cold data region 102 based on the writing operation illustrated in FIGS. 6 and 7 (step ST403).

For example, the sequencer 19 notifies that the data transfer is completed on an inside of the flash memory 201 by the ready and busy signal RBn of the H level to the memory controller 200 (step ST404).

The memory controller 200 receives notification of completion of the operation (step ST43).

The memory controller 200 revises information within the management tables TBL and TBL1 at timing before execution or after execution of transfer of internal data to change an address of a storage destination of the data.

The internal transfer of the data within the flash memory in the memory system according to the embodiment is completed by the operation described above.

In addition, the data within the cold data region 102 in which the access frequency is high may be transferred within the normal data region 101 in accordance with the usage situation of the user.

As described above, the memory system according to the embodiment can transfer the data between the normal data region 101 and the cold data region 102 on the inside of the flash memory 201 in accordance with the access frequency of the data.

Thus, the memory system according to the embodiment can prevent degradation (decrease in reliability) of the data.

b-5) Operation to Normal Data Region

Each operation to the normal data region 101 of the flash memory 201 is executed as follows.

Writing of the data, reading of the data, and erasing of the data to the normal data region 101 are different from each operation to the cold data region 102 in that each command to the normal data region 101 does not include the mode signal CZ.

In writing of the data and reading of the data to the normal data region 101, one word line (for example, the word line WLk) is selected based on the selected address ADR.

Control with respect to the non-selected word lines WLk+1 and otherWLs, the drain-side and source-side select gate lines SGD (SGD-sel and SGD-unset) and SGS, the bit line BL, the source line SRC, and the well contact CPWELL in the normal data region 101 is substantially the same as the control of various wiring in writing of the data and reading of the data to the cold data region 102.

In addition, the shift read process to the normal data region 101 is executed by adjusting the voltage value of the reading voltage Vcgr based on setting information that is set in advance.

In the embodiment, the erasing operation in the normal data region 101 is substantially the same as the erasing operation in the cold data region 102.

In a case where writing of the data and reading of the data in the normal data region 101 indicate writing and reading (writing and reading of the data in the SLC region) of binary (1 bit), the command to the normal data region 101 includes a signal (SLC mode signal) A2$h$ indicating writing of binary without addition of the mode signal CZ.

For example, when neither of the mode signals A2$h$ and A3$h$ is added to the command, the command transmitted from the memory controller 200 indicates an operation of a multi-value mode (MLC mode) with respect to the normal data region 101 (for example, the MLC region).

In addition, in the flash memory according to the embodiment, the memory controller 200 can execute writing and reading of the multi-value data with respect to the memory cell MCB (MLC region) of the cold data region 102 by transmitting the command and the signal indicating the operation of the MLC mode to the cold data region 102.

c) Summary

The flash memory according to the embodiment includes the first region 101 and the second region 102.

The number of the memory transistors of the second memory cell MCB in the second region 102 is greater than the number of the memory transistors of the first memory cell MCA in the first region 101.

Therefore, the effective size (area) of the memory film of the second memory cell MCB is greater than the effective size (area) of the memory film of the first memory cell MCA. In addition, in the second region 102, the memory film 79 facing the interlayer insulating film 89 between the pluralities of the control gate electrodes 71 of the memory cell MCB also affects the retention characteristics of the data of the memory cell MCB as a portion of the memory film of the memory cell MCB.

Thus, in the flash memory according to the embodiment, the second memory cell MCB can suppress shifts in the threshold voltage of the memory cell due to leakage of the charge within the memory film.

Thus, the memory system according to the embodiment can improve reliability of the memory.

2) Application Examples

Application examples of the memory system according to the embodiment will be described with reference to FIGS. 16 to 19.

(2-1) First Application Example

A first application example of the memory system (storage device) according to the embodiment will be described with reference to FIGS. 16 to 18.

The memory system according to the embodiment is used for a storage device such as a memory card and a USB memory.

Figure 16:
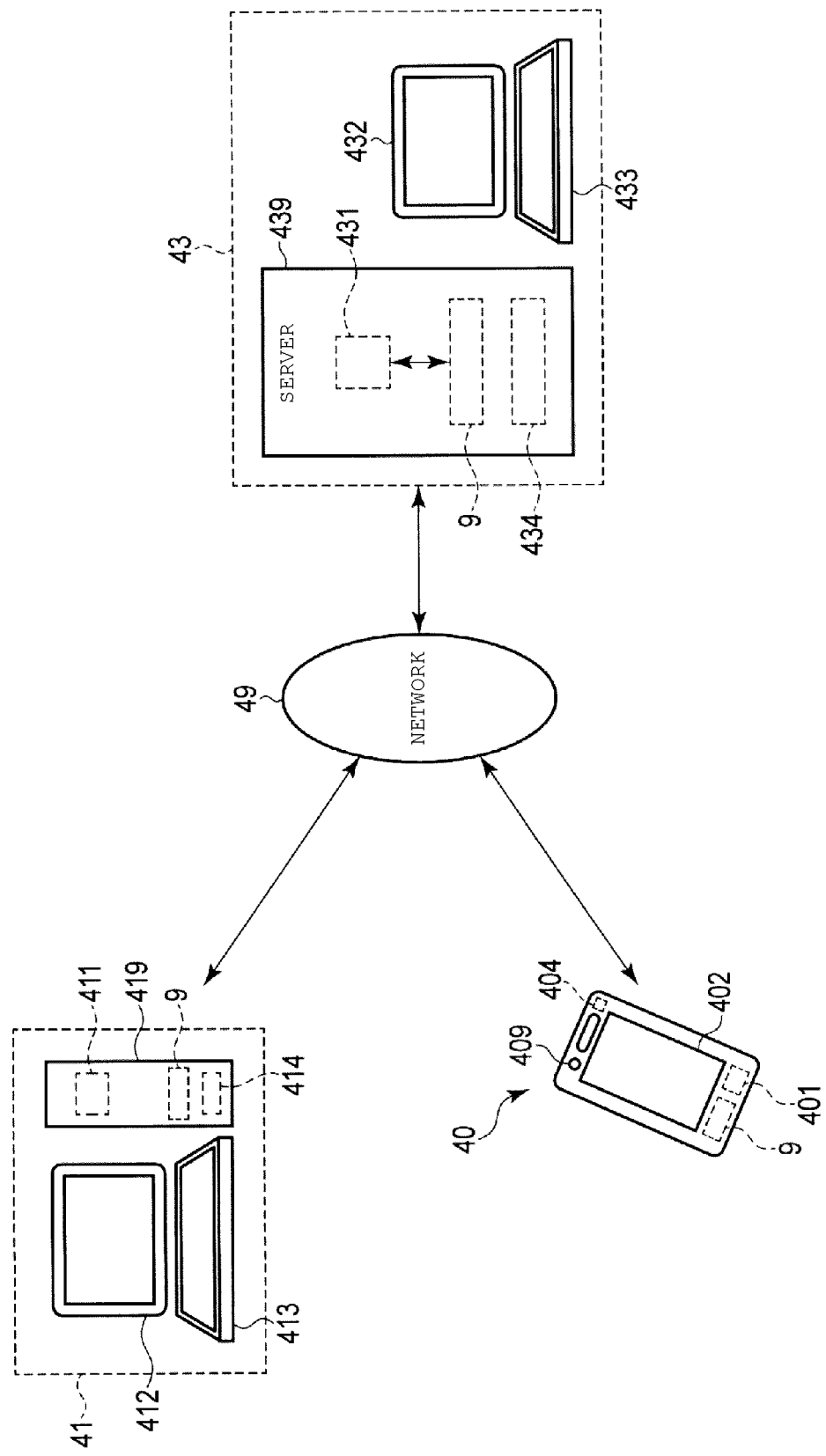
FIG. 16 is a diagram illustrating an application example of the memory system according to the embodiment.

For example, as illustrated in FIG. 16, a memory system 9 as a memory card 9 according to the application example of the embodiment is mounted on a smart phone 40.

The smart phone 40 includes a touch panel 402. The touch panel 402 functions as address display device and an input unit of the smart phone 40.

The smart phone 40 includes a CPU (application processor) 401. The CPU 401 controls an operation of the smart phone 40. The smart phone 40 includes a transmitting and receiving unit (communication function) 404 for communication with another device. For example, the smart phone 40 includes a camera function 409. For example, the digital camera 409 is mounted on the smart phone 40. The smart phone 40 includes application software. The application software is stored, for example, within the memory card 9.

In addition, the memory system according to the embodiment is used in a solid state drive (SSD).

The memory system 9 as the SSD 9 is mounted on a PC 41 and a server 43.

The PC 41 includes a CPU 411, a display device (display unit) 412, a keyboard (input unit) 413, a transmitting and receiving unit 414, and the SSD 9. The CPU 411, the transmitting and receiving unit 414, and the SSD 9 are provided within a housing 419. The CPU 411 controls an operation of an entirety of the PC 41.

The server 43 includes a CPU 431, a display device 432, a keyboard 433, a transmitting and receiving unit 434, and an SSD 9. The CPU 431, the transmitting and receiving unit 434, and the SSD 9 are provided within a housing 439. The CPU 411 controls an operation of an entirety of the server 43.

In addition, the PC 41 and the server 43 may include a display device (for example, HDD) in addition to the SSD 9.

The smart phone 40, the PC 41, and the server 43 are able to communicate with each other via a network 49 by the transmitting and receiving units 404, 414, and 434. The network 49 includes, for example, a base station (access point).

Operation Example

The memory card 9 of the application example mounted on the smart phone 40 is used as follows.

Figure 17:
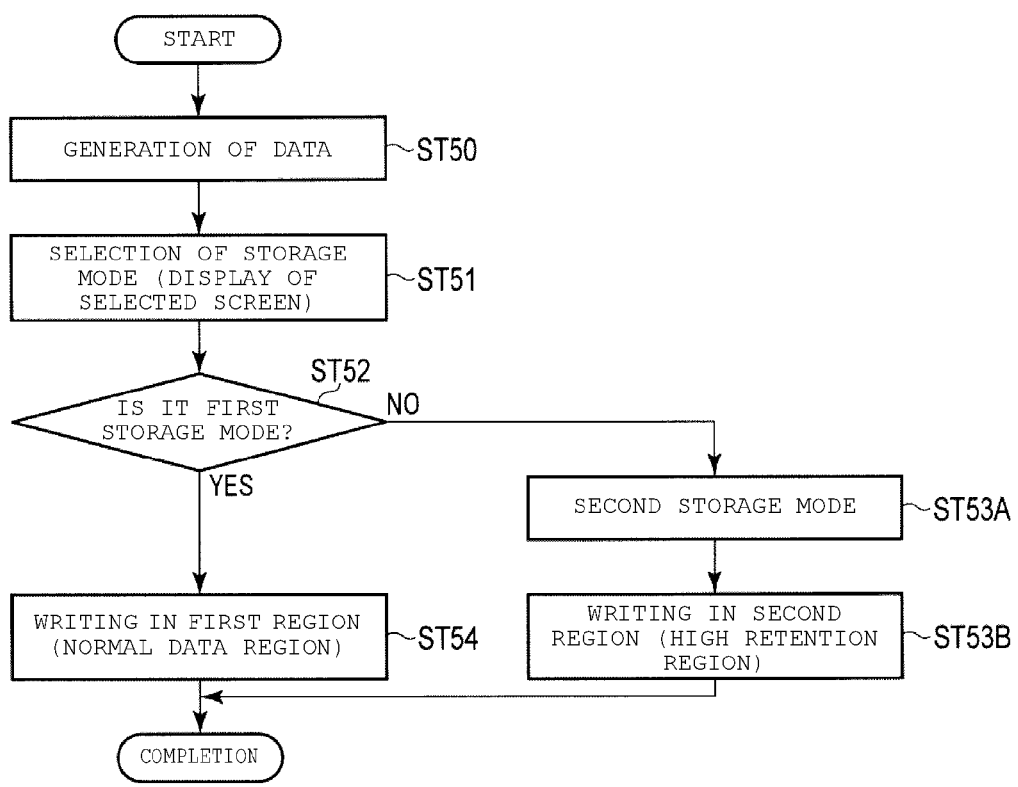
FIG. 17 is a flowchart of the application example of the memory system according to the embodiment.

As illustrated in a flowchart of FIG. 17, the smart phone 40 performs, for example, processes such as creation of data by application software, imaging (imaging of still image or moving image) of an object by the digital camera 409, download of data from the network (for example, a web page) 49, and transmitting and receiving of e-mail by the use of the user. As a result, data to be stored within the memory card 9 is generated (step ST50).

For example, the smart phone 40 causes the user to confirm whether data (for example, image data that is imaged) that is generated by control of the CPU 401 is stored within the memory card 9 in any storage mode (steps ST 51 and ST52).

Figure 18:
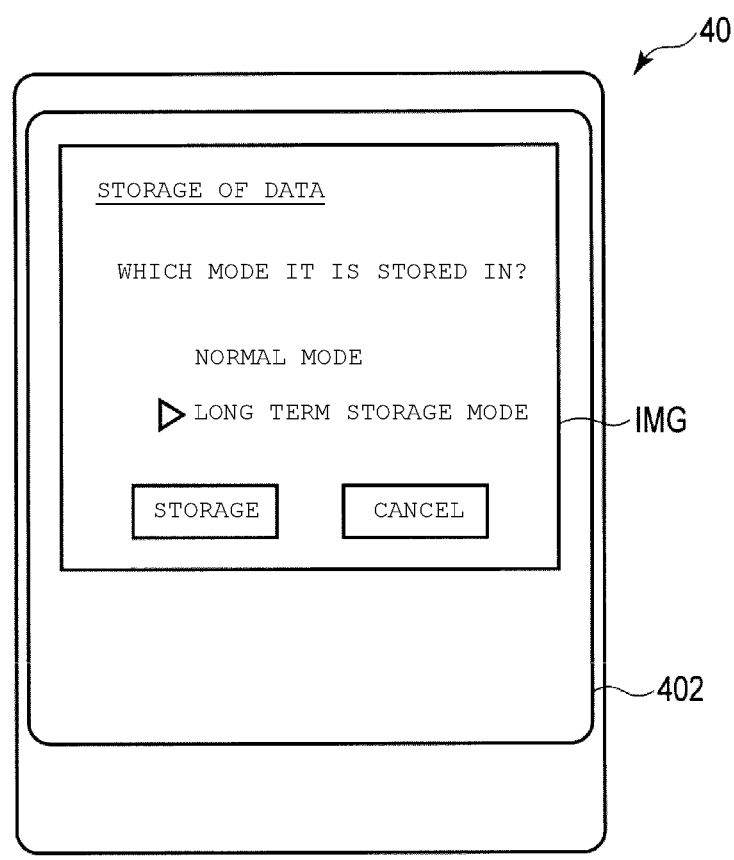
FIG. 18 is a diagram illustrating a user interface of the application example of the memory system according to the embodiment.

For example, the CPU 401 displays a confirmation image IMG illustrated in FIG. 18 on the touch panel (display device) 402 when storing data with respect to the memory card 9 (step ST51). Thus, the CPU 401 causes the user to confirm whether the data is stored within the memory card 9 by a first mode (hereinafter, referred to as a normal mode) or is stored within the memory card 9 by a second mode (hereinafter, referred to as a long-term storage mode) based on the display of the confirmation image IMG.

The normal mode is a mode in which the data is stored (written) within the normal data region 101 of the flash memory 201 within the memory card 9.

The long-term storage mode (also referred to as a high retention mode) is a mode in which the data is stored within the cold data region 102 of the flash memory 201 within the memory card 9.

The user selects whether the data is stored by the normal mode or is stored by the long-term storage mode by operating the touch panel 402 based on the confirmation image IMG that is displayed.

In step ST52, if the long-term storage mode is selected by the user (step ST53A), the CPU 401 requests writing of the data to the cold data region 102 of the flash memory 201 from the memory card 9 (memory controller 200). The memory card 9 writes the data within the cold data region (high retention region) 102 within the flash memory 201 by the writing operation illustrated in FIGS. 6 and 7 (step ST53B).

In step ST52, if the normal mode is selected by the user, the CPU 401 requests writing of the data to the normal data region 101 of the flash memory 201 from the memory card 9. The memory card 9 writes the data to the normal data region 101 based on the request from the CPU 401 (step ST54).

As described above, the data acquired by the smart phone 40 is stored within the memory card 9.

Reading of the data from the memory card 9 is executed by the reading operation illustrated in FIGS. 8 and 9.

When managing the data within the smart phone 40 (memory card 9) by the user, the confirmation image IMG illustrated in FIG. 18 may be displayed on the touch panel 402. Thus, the smart phone 40 can supply execution of internal transfer (relocation of the data) of the data within the memory card 9 illustrated in FIGS. 12 to 15 to the user after storage of the data to the memory card 9.

Thus, during managing the data, the data that is selected within the normal data region 101 is relocated within the cold data region 102 by instruction from the user or the data that is selected within the cold data region 102 is relocated within the normal data region 102 by the instruction from the user.

The smart phone 40 may execute relocation of the data within the memory card 9 without request from the user.

For example, if the image data stored within the memory card 9 by the normal mode is not accessed by the user in a period from start of the storage to a certain time, or in a period from the previous access by the user to a certain time, the CPU 401 may change the storage region of the image data that is not accessed from the normal data region 101 to the cold data region 102 by the process illustrated in FIGS. 12 to 15 without the operation of the user.

In addition, the PC 41 can supply substantially the same function as the memory card 9 described above to the user by the SSD 9.

The memory card 9 of the application example of the embodiment can be mounted on a device such as a mobile phone, a tablet device, a digital camera, a PC, and a printer.

As described above, the memory card of the application example can store the data within the flash memory 201 of high retention characteristics.

As described above, the memory system (and storage device) according to the embodiment can be applied to the memory card.

(2-2) Application Example 2

Here, a second application example of the memory system according to the embodiment will be described.

A server 43 including an SSD 9 of the application example illustrated in FIG. 16 holds image data that is uploaded from the user, customer data (personal information), raw data of experiments, raw data of statistics, and the like in the SSD 9. In addition, the server 43 holds e-mail and the like within a storage region within the server 43.

The server 43 and the user (smart phone 40 and the PC 41) transmit and receive data via a network 49 by examples as follows.

For example, the smart phone 40 uploads image data and text data to the server 43 via the network 49 by using social networking service (SNS) by the user.

The PC 41 uploads raw data of an experiment result and the like to the server 43 to share the data or to ensure higher level of security than the PC 41 by the operation of the user.

For example, the server 43 supplies a questionnaire to a terminal such as the smart phone 40 and the PC 41 via the network 49 and performs market research. The user using the terminals 40 and 41 transmits a response result of the questionnaire to the server 43. Thus, the server 43 collects the custom data, the statistical data, and the like.

The data that is uploaded by the user and the data that is collected by the server 43 are stored in the SSD 9 within the server 43.

For example, the CPU 431 automatically stores the data within the cold data region 102 of the flash memory 201 within the SSD 9.

The server 43 may display the confirmation image IMG in a display device 432 by a process of the CPU 431 during storing the data. Thus, a manager (user of the server 43) can select whether the data supplied to the server 43 is stored within the SSD 9 by the normal mode or is stored within the SSD 9 by the long-term storage mode based on the process of FIG. 17.

If the long-term storage mode is selected, the server 43 writes the data to the cold data region 102 within the SSD 9 by the writing operation based on FIGS. 6 and 7. If the normal mode is selected, the server 43 writes the data to the normal data region 101 within the SSD 9.

In addition, the server 43 may automatically determine whether the data received by the server is stored in the cold data region or the normal data region based on data file extension.

The user requests reading of the data from the SSD 9, for example, as a result of access to a web page, to the server 43 from the terminals 40 and 41 of the user.

As described above, if access is performed to a certain web page from certain terminals 40 and 41, the server 43 reads the image data and the like included in contents of the web page from the cold data region 102 of the SSD 9 by the operation of FIGS. 8 and 9. The server 43 supplies the read data to the terminals 40 and 41 of the user via the network 49 as the web page.

In addition, the PC 41 requests reading of raw data of the experiments or statistics to the server 43. The server 43 reads the raw data from the cold data region 102 of the SSD 9 based on the request from the PC 41. The server 43 supplies the read data to the PC 41 via the network 49.

The server 43 can execute transfer (relocation of the data) of the data between the normal data region 101 and the cold data region 102 by the operation based on FIGS. 12 to 15.

For example, the server 43 can relocate the data in association with the web page within the normal data region 101 within the cold data region 102 based on the number of accesses to the web page and the final updated date and time of the web page. The server 43 can relocate the data of the web page within the cold data region 102 within the normal data region 101 based on the number of accesses to the web page of a certain user.

As described above, the server 43 of the application example can store the data in the SSD 9 including the flash memory 201 of the high retention characteristics. Thus, the server 43 of the application example can supply the data (data that is almost not degraded) including high reliability to the user (manager or the user of the terminal) even if the data is stored within the SSD 9 without being accessed for a long period of time.

As described above, the memory system (and storage device) according to the embodiment can be applied to the storage device of the server.

(2-3) Third Application Example

A third application example of the memory system according to the embodiment will be described with reference to FIG. 19.

The memory system according to the embodiment can be applied to an information reading and reproducing device (recorder) 51.

The recorder 51 records video data supplied by television broadcast or Internet distribution. The recorder 51 includes an SSD 9, a CPU 511, an HDD 512, an optical disk drive 513, and a transmitting and receiving unit 519.

Figure 19:
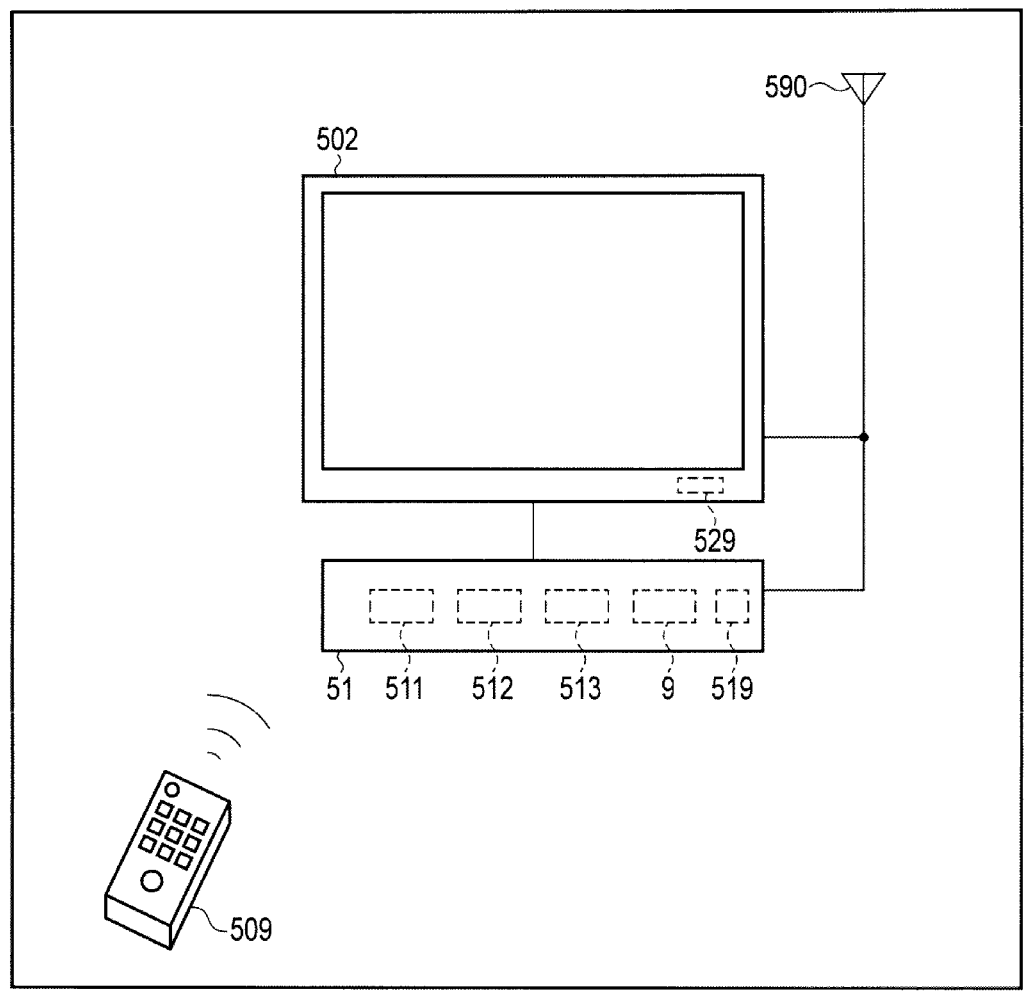
FIG. 19 is a conceptual diagram illustrating the application example of the memory system according to the embodiment.

As illustrated in FIG. 19, the recorder 51 of the application example is connected to a display device (for example, a liquid crystal display device) 502.

The display device 502 includes a transmitting and receiving unit 529. The display device 502 displays a video image corresponding to a signal (video image signal) received by the transmitting and receiving unit 529 via an antenna 590. For example, the video image signal is supplied to the recorder 51. The video image signal (video image data) may be supplied from the Internet to the display device 502 and the recorder 51 via a cable, optical fiber, wireless communication, and the like.

The recorder 51 can reproduce data within the SSD 9, the HDD 512 and the optical disk. The display device 502 can display the video image data that is reproduced by the recorder 51.

A remote controller (operation device) 509 transmits a control signal for controlling an operation of the display device 502 and the recorder 51. The display device 502 and the recorder 51 receive the control signal by the transmitting and receiving units 519 and 529. Thus, the operation of the display device 502 and the recorder 51 is controlled by the user that operates the remote controller 509.

The recorder 51 records received video image data within the SSD 9 in accordance with the request from the user, for example, based on the process of FIG. 17.

The recorder 51 displays the confirmation image IMG of FIG. 18 on the display device 502 so that the user confirms whether the video image data is stored in the normal mode or stored in the long-term storage mode in a reservation screen of video recording data or a management screen of data.

One of the normal mode and the long-term storage mode is selected by the control signal from the remote controller 509. The CPU 511 stores the video image data in one of the normal data region 101 and the cold data region 102 of the flash memory 201 of the SSD 9 based on a selection result of the storage mode.

The recorder 51 can store video image data of a program in parallel with viewing of video images by the user. In this case, since the user views the video images, the recorded video image data may be long in a period from recording of the data to the next access (reproduction). Therefore, if the video image data during viewing of the user is stored in the recorder 51, the recorder 51 may automatically record the data within the cold data region 102 without instruction of the user.

In addition, as the operation described with reference to FIGS. 12 to 15, if the CPU 511 detects that the access is not present from the user in a certain period from the completion of video recording or a certain period from final viewing date and time (final access date and time) to the stored video image data based on the management table TBL1, the CPU 511 may relocate the video image data that is not accessed within the SSD 9 from the normal data region 101 to the cold data region 102 without request from the user. The data within the HDD 513 may be relocated in the cold data region 102 by the CPU 511 or the user.

In addition, functions of the recorder 51 and the SSD 9 of the application example may be applied to the memory system 9 within a PC 41 or a portable terminal 40 capable of receiving the television broadcast or the Internet distribution.

As described above, in the application example, the recorder 51 can store the data within the SSD 9 including the flash memory including the high retention characteristics. Thus, the recorder of the application example can supply the data including high reliability to the user even if the data is stored within the storage device without being accessed for a long period of time.

As described above, the memory system according to the embodiment can be applied to the recorder.

(3) Others

The flash memory used in the memory system according to the embodiment may also be a multi-value the flash memory.

An operation of reading of the multi-value flash memory includes a determination voltage as follows.

The determination voltage that is applied to the word line selected for an operation of reading of an A level is, for example, between 0 V and 0.55V. However, the determination voltage of the A level is not limited to the value and may be any one of range of from 0.1 V to 0.24 V, from 0.24 V to 0.31 V, from 0.31 V to 0.4 V, from 0.4 V to 0.5 V, and from 0.5 V to 0.55 V.

The determination voltage that is applied to the word line selected for an operation of reading of a B level is, for example, between 1.5 V and 2.3 V. However, the determination voltage of the B level is not limited to the value and may be any one of range of from 1.65 V to 1.8 V, from 1.8 V to 1.95 V, from 1.95 V to 2.1 V, and from 2.1 V to 2.3 V.

The determination voltage that is applied to the word line selected for an operation of reading of a C level is, for example, between 3.0 V and 4.0 V. However, the determination voltage of the C level is not limited to the value and may be any one of range of from 3.0 V to 3.2 V, from 3.2 V to 3.4 V, from 3.4 V to 3.5 V, from 3.5 V to 3.6 V, and from 3.6 V to 4.0 V.

In addition, a period (tR) of the reading operation is, for example, may be one of periods of from 25 μs to 38 μs, from 38 μs to 70 μs, and from 70 μs to 80 μs.

The writing operation of the multi-value flash memory includes the program operation and the verify operation.

In the writing operation of the multi-value flash memory, a voltage initially applied to the word line that is selected during the program operation is, for example, between 13.7 V and 14.3 V. The voltage is not limited to the value and, for example, may be any one of ranges of from 13.7 V to 14.0 V and from 14.0 V to 14.6 V.

If the program operation is an incremental step pulse program (ISPP) type, a voltage of step-up is, for example, approximately 0.5 V.

A non-selected voltage (pass voltage) applied to the non-selected word line is, for example, a value of a range of from 6.0 V to 7.3 V. However, the non-selected voltage is not limited to the value and may be, for example, a value of a range of from 7.3 V to 8.4 V or may be equal to or less than 6.0 V.

The non-selected word line is an odd-numbered word line, but the voltage to be applied may be changed to an even-numbered word line.

The time (tProg) of the writing operation is, for example, may be any one of periods of from 1,700 μs to 1,800 μs, from 1,800 μs to 1,900 μs, and from 1,900 μs to 2,000 μs.

An erasing operation of the multi-value flash memory is formed on an upper portion of the semiconductor substrate and a voltage initially applied to the well region arranged where the memory cell is arranged above is, for example, a value of a range of from 12 V to 13.6 V. The voltage is not limited to the value and may be, for example, any one of ranges of from 13.6 V to 14.8 V, from 14.8 V to 19.0 V, from 19.0 V to 19.8 V and from 19.8 V to 21 V.

The time (tErase) of the erasing operation is, for example, may be any one of periods of from 3,000 μs to 4,000 μs, from 4,000 μs to 5,000 μs, and from 5,000 μs to 9,000 μs.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
   a memory device that includes
      a memory cell array having a plurality of memory string units including a first memory string unit and a second memory string unit, each of the memory string units including a plurality of memory strings, each memory string having a first transistor, a second transistor, and a plurality of memory cells connected between the first transistor and the second transistor, the plurality of memory cells including a first memory cell and a second memory cell,
      a first word line connected to gates of the first memory cells in the first and second memory string units,
      a second word line connected to gates of the second memory cells in the first and second memory string units,
      a first select gate line connected to the first transistors in the first memory string unit, and
      a second select gate line connected to the first transistors in the second memory string unit; and
   a controller configured to control an operation of the memory device,
   wherein during reading from or writing to the first memory string unit, the memory device selects the first select gate line, does not select the second select gate line, and while the first select gate line is selected and the second select gate line is not selected, simultaneously reads from or writes to the first and second memory cells in the memory strings of the first memory string unit.

2. The system according to claim 1, wherein the memory device selects the first and second word lines during the reading from or writing to the first memory string unit.

3. The system according to claim 2, wherein the first and second word lines are adjacent word lines.

4. The system according to claim 1, wherein the first memory cells and the second memory cells are single-level cells and one page of data is read or written with the selection of first and second word lines.

5. A method of performing a reading operation in a memory device that includes
a memory cell array having a plurality of memory string units including a first memory string unit and a second memory string unit, each of the memory string units including a plurality of memory strings, each memory string having a first transistor, a second transistor, and a plurality of memory cells connected between the first transistor and the second transistor, the plurality of memory cells including a first memory cell and a second memory cell,
a first word line connected to gates of the first memory cells in the first and second memory string units,
a second word line connected to gates of the second memory cells in the first and second memory string units,
a first select gate line connected to the first transistors in the first memory string unit, and
a second select gate line connected to the first transistors in the second memory string unit,
said method comprising:
upon receiving a command to read from the first memory string unit, selecting the first select gate line and not selecting the second select gate line, and while the first select gate line is selected and the second select gate line is not selected, applying a first read voltage to the first and second word lines at the same time.

6. The method according to claim 5, wherein the first and second word lines are adjacent word lines.

7. The method according to claim 5, wherein the first memory cells and the second memory cells are single-level cells and one page of data is read with the selection of first and second word lines.

8. A method of performing a writing operation in a memory device that includes
a memory cell array having a plurality of memory string units including a first memory string unit and a second memory string unit, each of the memory string units including a plurality of memory strings, each memory string having a first transistor, a second transistor, and a plurality of memory cells connected between the first transistor and the second transistor, the plurality of memory cells including a first memory cell and a second memory cell,
a first word line connected to gates of the first memory cells in the first and second memory string units,
a second word line connected to gates of the second memory cells in the first and second memory string units,
a first select gate line connected to the first transistors in the first memory string unit, and
a second select gate line connected to the first transistors in the second memory string unit,
said method comprising:
upon receiving a command to write to the first memory string unit, selecting the first select gate line and not selecting the second select gate line, and while the first select gate line is selected and the second select gate line is not selected, applying a first programming voltage to the first and second word lines at the same time.

9. The method according to claim 8, wherein the first and second word lines are adjacent word lines.

10. The method according to claim 8, wherein the first memory cells and the second memory cells are single-level cells and one page of data is written with the selection of first and second word lines.

11. The system according to claim 1 wherein when the memory device reads from or write to the first and second memory cells in the first memory string unit, the memory device does not read from or write to the first and second memory cells in the second memory string unit.

12. The system according to claim 1, wherein the memory device further includes:
a bit line connected to a first memory string, which is one of the memory strings of the first memory string unit, and a second memory string, which is one of the memory strings in the second memory string unit.

13. The system according to claim 1, wherein
the memory device is configured to divide the memory cell array into a first region and a second region, the first memory string unit and the second memory string unit belonging to the first region, and
the plurality of memory string units further includes a third memory string unit belonging to the second region, wherein the memory device selects a word line one at a time when reading from or writing to the memory cells in the third memory string unit.

14. The system according to claim 13,
wherein the controller transmits a read or write command with a first control signal indicating that a read or write target is in the first region, and transmits the read or write command without the first control signal if the read or write target is in the second region.

15. The system according to claim 13,
wherein the first region stores a read voltage and a shift read voltage to be used when reading from a read or write target that is in the first region and a programming voltage to be used when writing to the read or write target that is in the first region.

16. The system according to claim 13, wherein the controller is configured to maintain access frequency information of a page of data stored in the second region and to transfer the page of data stored in the second region to the first region based on the access frequency.

17. The system according to claim 16, wherein the controller instructs the memory device to transfer the page of data stored in the second region to the first region when the controller determines that the access frequency of the page of data is below a threshold.

18. The system according to claim 17, wherein the controller maps the page of data to an address within the first region upon receiving confirmation from the memory device that the transfer has completed.

19. The method according to claim 5, wherein
the memory device is configured to divide the memory cell array into a first region and a second region and to read the first read voltage from the first region, the first memory string unit and the second memory string unit belonging to the first region, and
the plurality of memory string units further includes a third memory string unit belonging to the second region, wherein the memory device selects a word line one at a time when reading from the memory cells in the third memory string unit.

20. The method according to claim 8, wherein the memory device is configured to divide the memory cell array into a first region and a second region and to read the first programming voltage from the first region, the first memory string unit and the second memory string unit belonging to the first region, and the plurality of memory string units further includes a third memory string unit belonging to the second region, wherein the memory device selects a word line one at a time when writing to the memory cells in the third memory string unit.

\* \* \* \* \*